(12) United States Patent
Shimoyama et al.

(10) Patent No.: US 11,703,759 B2
(45) Date of Patent: Jul. 18, 2023

(54) TRANSFER FILM, ELECTRODE PROTECTIVE FILM, LAMINATE, CAPACITIVE INPUT DEVICE, AND MANUFACTURING METHOD OF TOUCH PANEL

(71) Applicant: FUJIFILM Corporation, Tokyo (JP)

(72) Inventors: Tatsuya Shimoyama, Fujinomiya (JP); Akihiro Hakamata, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 420 days.

(21) Appl. No.: 16/876,687

(22) Filed: May 18, 2020

(65) Prior Publication Data

US 2020/0278610 A1 Sep. 3, 2020

Related U.S. Application Data

(63) Continuation of application No. PCT/JP2018/038993, filed on Oct. 19, 2018.

(30) Foreign Application Priority Data

Dec. 27, 2017 (JP) ................................. 2017-252308

(51) Int. Cl.
*G03F 7/033* (2006.01)
*C08F 220/18* (2006.01)
(Continued)

(52) U.S. Cl.
CPC .............. *G03F 7/033* (2013.01); *B32B 27/16* (2013.01); *B32B 27/26* (2013.01);
(Continued)

(58) Field of Classification Search
CPC ............. G03F 7/033; G03F 7/34; G03F 7/161
See application file for complete search history.

(56) References Cited

U.S. PATENT DOCUMENTS

2004/0142280 A1 7/2004 Iwanaga et al.
2016/0274688 A1* 9/2016 Ando ..................... B32B 7/12
(Continued)

FOREIGN PATENT DOCUMENTS

CN 1509424 A 6/2004
CN 105911819 A 8/2016
(Continued)

OTHER PUBLICATIONS

Machine translation of JP 2013-120233 (no date).*
(Continued)

*Primary Examiner* — Amanda C. Walke
(74) *Attorney, Agent, or Firm* — Sughrue Mion, PLLC

(57) ABSTRACT

A transfer film includes a temporary support; and a photosensitive layer, in which the photosensitive layer includes a polymer A containing a constitutional unit represented by Formula A1, a constitutional unit derived from a monomer having an alicyclic structure, and a constitutional unit having a radically polymerizable group, a radically polymerizable compound, and a photopolymerization initiator, a content of the constitutional unit represented by Formula A1 is 10% by mass or more with respect to a total mass of the polymer A, a content of the constitutional unit derived from the monomer having the alicyclic structure is 15% by mass or more with respect to a total mass of the polymer A, and a glass transition temperature of a homopolymer of the monomer having the alicyclic structure is 120° C. or higher.

Formula A1

(Continued)

22 Claims, 2 Drawing Sheets

(51) Int. Cl.
  B32B 27/16       (2006.01)
  B32B 27/26       (2006.01)
  C08F 220/52      (2006.01)
  C08F 222/20      (2006.01)
  G03F 7/038       (2006.01)
  G03F 7/20        (2006.01)
  G03F 7/26        (2006.01)
  G06F 3/044       (2006.01)
  H05K 3/28        (2006.01)

(52) U.S. Cl.
  CPC ...... *C08F 220/1811* (2020.02); *C08F 220/52* (2013.01); *C08F 222/20* (2013.01); *G03F 7/038* (2013.01); *G03F 7/2004* (2013.01); *G03F 7/26* (2013.01); *G06F 3/044* (2013.01); *H05K 3/287* (2013.01); *B32B 2457/208* (2013.01); *G06F 2203/04103* (2013.01)

(56) References Cited

U.S. PATENT DOCUMENTS

| | | | |
|---|---|---|---|
| 2016/0274695 A1* | 9/2016 | Ando | G02B 1/113 |
| 2017/0146905 A1 | 5/2017 | Aridomi et al. | |
| 2017/0364177 A1 | 12/2017 | Toyooka | |
| 2018/0173095 A1* | 6/2018 | Kanna | C08F 2/48 |

FOREIGN PATENT DOCUMENTS

| | | | | |
|---|---|---|---|---|
| CN | 106574131 A | | 4/2017 | |
| CN | 107250958 A | | 10/2017 | |
| CN | 108025533 A | * | 5/2018 | ............ B32B 27/00 |
| DE | 19843926 A1 | * | 3/2000 | ............ C08F 220/10 |
| EP | 2393895 B1 | * | 12/2015 | ............ C08L 25/00 |
| JP | 62141012 A | * | 6/1987 | |
| JP | 2003-241372 A | | 8/2003 | |
| JP | 2007-078890 A | | 3/2007 | |
| JP | 2009-229720 A | | 10/2009 | |
| JP | 2013-076821 A | | 4/2013 | |
| JP | 2013120233 A | * | 6/2013 | |
| JP | 2015-022029 A | | 2/2015 | |
| JP | 2015-22030 A | | 2/2015 | |
| JP | 2015-193758 A | | 11/2015 | |
| JP | 2016-153834 A | | 8/2016 | |
| JP | 2017-181740 A | | 10/2017 | |
| WO | WO-2009047949 A1 | * | 4/2009 | ......... C08F 290/046 |
| WO | WO-2016051971 A1 | * | 4/2016 | ............ B32B 15/04 |

OTHER PUBLICATIONS

Machine translation of JP 2015-193758 (no date).*
Machine translation of JP 2016-153834 (no date).*
International Search Report dated Dec. 25, 2018, issued by the International Searching Authority in application No. PCT/JP2018/038993.
Written Opinion dated Dec. 25, 2018, issued by the International Searching Authority in application No. PCT/JP2018/038993.
International Preliminary Report on Patentability dated Jun. 30, 2020, issued by the International Bureau in application No. PCT/JP2018/038993.
Office Action dated Feb. 15, 2022 in Japanese Application No. 2019-562783.
Communication dated Nov. 3, 2021, issued by the Taiwanese Patent Office in application No. 107137877.
Communication dated May 25, 2021 from the Japanese Patent Office in Application No. 2019-562783.
Office Action dated Aug. 9, 2022 in Japanese Application No. 2019-562783.
Office Action dated Dec. 8, 2022 from the China National Intellectual Property Administration in CN Application No. 201880079579.1.

* cited by examiner

TRANSFER FILM, ELECTRODE PROTECTIVE FILM, LAMINATE, CAPACITIVE INPUT DEVICE, AND MANUFACTURING METHOD OF TOUCH PANEL

CROSS-REFERENCE TO RELATED APPLICATIONS

This application is a Continuation of PCT International Application No. PCT/JP2018/038993 filed on Oct. 19, 2018, which claims priority under 35 U.S.C § 119(a) to Japanese Patent Application No. 2017-252308 filed on Dec. 27, 2017. Each of the above application(s) is hereby expressly incorporated by reference, in its entirety, into the present application.

BACKGROUND OF THE INVENTION

1. Field of the Invention

The present disclosure relates to a transfer film, an electrode protective film, a laminate, a capacitive input device, and a manufacturing method of a touch panel.

2. Description of the Related Art

In the related art, a photosensitive composition and a transfer film including a photosensitive layer formed of the photosensitive composition (also referred to as a "photosensitive film") have been known.

JP2009-229720A discloses a photosensitive resin composition containing a resin, a polymerizable compound having a structure represented by General Formula (1), and a photopolymerization initiator.

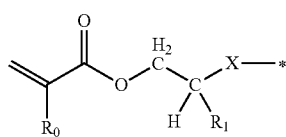

Formula (1)

The structure represented by General Formula (1) is bonded to another structure at a position of * to form a polymerizable compound. In General Formula (1), $R_0$ represents a hydrogen atom or a methyl group, and $R_1$ represents a hydrogen atom, a monovalent organic group, or a divalent organic group which forms a cyclic structure containing —$R_1$CHX— by bonding to the above-mentioned other structure. X represents —O—, —$NR_2$— or —S—. R2 represents a hydrogen atom, a monovalent organic group, or a divalent organic group which forms a cyclic structure containing —$R_2$N— by bonding to the above-mentioned other structure.

SUMMARY OF THE INVENTION

In some cases, a decrease in water vapor transmission rate (WVTR) is necessary for a cured film obtained by hardening a photosensitive layer of a transfer film. For example, in a case of forming a protective film for a touch panel included in a touch panel, as the cured film obtained by hardening a photosensitive layer, a decrease in WVTR is necessary for the protective film for a touch panel to be formed (that is, cured film).

In this regard, in the cured film obtained by hardening a photosensitive layer formed of the photosensitive composition disclosed in JP2009-229720A, there is room for improvement in the decrease in WVTR.

In addition, in some cases, a decrease in tackiness is necessary for a photosensitive layer of a transfer film. In a case where the tackiness of the photosensitive layer is great, peeling of the temporary support may be difficult.

In addition, the photosensitive layer in the transfer film is transferred to a substrate, and then exposed and developed to form a patterned cured film. Here, in a case of the development, for example, a scratch may be generated on a surface of the photosensitive layer during the development due to contact between the photosensitive layer and a transport roll. It is considered that it is preferable to prevent the generation of the scratches, since a cured film having an excellent surface shape is obtained and the in-plane uniformity of optical properties of the cured film becomes excellent.

In the disclosure, the fact that the above-mentioned scratches are unlikely to be generated during development is also referred to as "excellent in scratch resistance in a developer".

An object of embodiments according to the disclosure is to provide a transfer film including a cured film having a decreased water vapor transmission rate (WVTR) and having a low tackiness and excellent scratch resistance in a developer, and an electrode protective film, a laminate, a capacitive input device, and a method for manufacturing a touch panel using the transfer film.

Methods for achieving the objects described above include the following aspects.

<1> A transfer film comprising: a temporary support; and a photosensitive layer,
in which the photosensitive layer includes
a polymer A containing a constitutional unit represented by Formula A1, a constitutional unit derived from a monomer having an alicyclic structure, and a constitutional unit having a radically polymerizable group,
a radically polymerizable compound, and
a photopolymerization initiator,
a content of the constitutional unit represented by Formula A1 is 10% by mass or more with respect to a total mass of the polymer A,
a content of the constitutional unit derived from the monomer having the alicyclic structure is 15% by mass or more with respect to the total mass of the polymer A, and
a glass transition temperature of a homopolymer of the monomer having the alicyclic structure is 120° C. or higher.

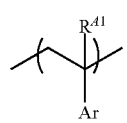

Formula A1

In Formula A1, Ar represents a phenyl group or a naphthyl group and $R^{41}$ represents a hydrogen atom or an alkyl group.

<2> The transfer film according to <1>, in which the polymer A further includes a constitutional unit having an acid group.

<3> The transfer film according to <1> or <2>, in which the photosensitive layer further includes a thermal cross-linking compound.

<4> The transfer film according to <3>, in which a thermal crosslinking group in the thermal crosslinking compound is a blocked isocyanate group.

<5> The transfer film according to <3> or <4>, in which the thermal crosslinking compound includes a radically polymerizable group.

<6> The transfer film according to any one of <1> to <5>, which is used for forming a protective film for a touch panel.

<7> An electrode protective film, comprising: the transfer film according to any one of <1> to <6>, from which the temporary support has been removed.

<8> A laminate comprising:
a photosensitive layer obtained by removing the temporary support from the transfer film according to any one of <1> to <6>, on a substrate including an electrode of a capacitive input device.

<9> A capacitive input device comprising: the electrode protective film according to <7> or the laminate according to <8>.

<10> A manufacturing method of a touch panel comprising:
preparing a substrate for a touch panel having a structure in which at least one of an electrode for a touch panel or a wiring for a touch panel is disposed on a substrate;
forming a photosensitive layer on a surface of the substrate for a touch panel, on a side where at least one of the electrode for a touch panel or the wiring for a touch panel is disposed, by using the transfer film according to any one of <1> to <6>;
performing pattern-exposing on the photosensitive layer formed on the substrate for a touch panel; and
developing the pattern-exposed photosensitive layer to obtain a protective film for a touch panel, the protective film protecting at least a part of at least one of the electrode for a touch panel or the wiring for a touch panel.

According to the embodiments according to the disclosure, there are provided a transfer film including a cured film having a decreased water vapor transmission rate (WVTR) and having a low tackiness and excellent scratch resistance in a developer, and an electrode protective film, a laminate, a capacitive input device, and a method for manufacturing a touch panel using the transfer film.

DESCRIPTION OF THE PREFERRED EMBODIMENTS

Figure 1:
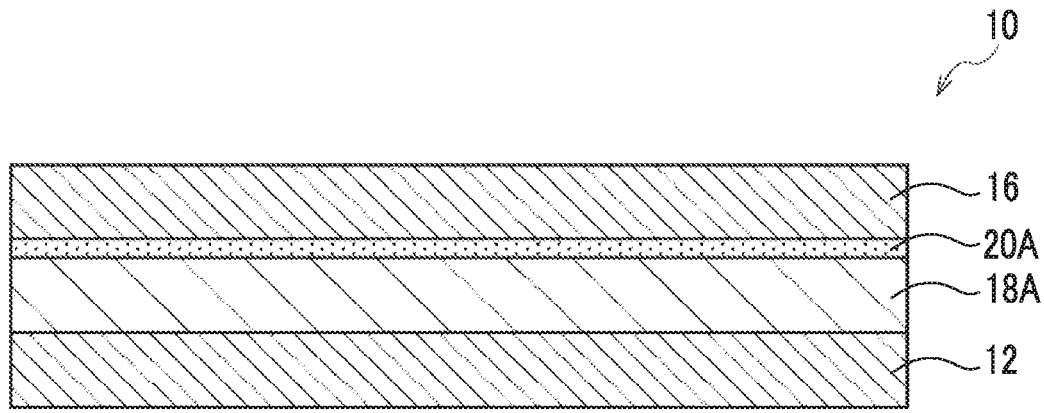
FIG. 1 is a schematic cross sectional view showing an example of a transfer film according to an embodiment of the invention.

Hereinafter, an embodiment of the invention will be described.

Regarding a term, group (atomic group) of this specification, a term with no description of "substituted" and "unsubstituted" includes both a group not including a substituent and a group including a substituent. For example, an "alkyl group" not only includes an alkyl group not including a substituent (unsubstituted alkyl group), but also an alkyl group including a substituent (substituted alkyl group). In addition, the "organic group" in this specification refers to a group containing at least one carbon atom.

In the specification, a range of numerical values expressed with "to" means a range including numerical values before and after "to" as a lower limit value and an upper limit value.

In the specification, in a case where a plurality of substances corresponding to components are present in a layer such as a photosensitive layer, an amount of each component in the layer such as the photosensitive layer means a total amount of the plurality of substances present in the layer such as the photosensitive layer, unless otherwise noted.

In the specification, a term "step" not only includes an independent step, but also includes a step, in a case where the step may not be distinguished from the other step, as long as the expected object of the step is achieved.

In the specification, "(meth)acrylic acid" has a concept including both acrylic acid and a methacrylic acid, "(meth)acrylate" has a concept including both acrylate and methacrylate, and "(meth)acryloyl group" has a concept including both acryloyl group and methacryloyl group.

In the specification, "light" has a concept including active energy ray such as a γ ray, a β ray, an electron ray, an ultraviolet ray, a visible light ray, and an infrared ray.

Unless otherwise noted, the term "exposure" in this specification means not only include exposure with a bright line spectrum of a mercury lamp, far ultraviolet ray represented by an excimer laser, extreme ultraviolet ray, X-ray, extreme ultraviolet (EUV) light, or the like, but also electronic light, and particle light such as ion beam.

In this specification, "transparent" means that a minimum transmittance at a wavelength of 400 nm to 800 nm at 23° C. is 80% or more (preferably 90% or more and more preferably 95% or more).

In addition, in the specification, a combination of two or more preferable aspects is the more preferable aspect.

(Transfer Film)

There is provided a transfer film according to the disclosure including a temporary support; and a photosensitive layer, in which the photosensitive layer includes a polymer A containing a constitutional unit (hereinafter, also referred to as a "constitutional unit A1") represented by Formula A1, a constitutional unit derived from a monomer having an alicyclic structure (hereinafter, also referred to as a "constitutional unit B1"), and a constitutional unit having a radically polymerizable group (hereinafter, also referred to as a "constitutional unit C1"), a radically polymerizable compound, and a photopolymerization initiator, a content of the constitutional unit represented by Formula A1 is 10% by mass or more with respect to a total mass of the polymer A, a content of the constitutional unit derived from the monomer having the alicyclic structure is 15% by mass or more with respect to a total mass of the polymer A, and a glass transition temperature (Tg) of a homopolymer of the monomer having the alicyclic structure is 120° C. or higher.

As a result of intensive studies, the inventors have found that a transfer film including a cured film having a decreased water vapor transmission rate (WVTR) and having a low tackiness and excellent scratch resistance in a developer is by using the above configuration.

The mechanism by which the above effects are obtained is not clear, but is surmised as follows.

It is considered that, by setting the content of the constitutional unit A1 in the polymer A as 10% by mass or more with respect to a total mass of the polymer A and the content of the constitutional unit B1 as 15% by mass with respect to a total mass of the polymer A, the cured film becomes hydrophobic, and accordingly, the WVTR is decreased.

In addition, it is considered that, by causing the polymer A to include the constitutional unit C1, the cured film obtained by the effect of the photosensitive layer is densified, so that the WVTR is decreased.

Further, it is considered that, by setting the content of the constitutional unit B1 in the polymer A as 15% by mass or more with respect to a total mass of the polymer A and the Tg of the homopolymer of the monomer having the alicyclic structure that forms the constitutional unit B1 as 120° C. or higher, fluidity of the photosensitive layer is reduced and tackiness of a surface of the photosensitive layer is excellent.

In the disclosure, a monomer having an alicyclic structure in the constitutional unit (constitutional unit B1) derived from the monomer having the alicyclic structure is also referred to as a "monomer having an alicyclic structure that forms the constitutional unit B1".

In addition, it is considered that, since the constitutional unit C1 in the polymer A forms a crosslinked structure with another constitutional unit C1 or a radically polymerizable compound, hardness of the surface of the photosensitive layer in a case of development is improved, and the scratch resistance in a developer is excellent.

The transfer film according to the disclosure is suitable for forming a cured film on a substrate. In a case of forming a cured film on a substrate using the transfer film according to the disclosure, for example, a photosensitive layer of the transfer film according to the disclosure is transferred to a substrate on which a cured film is to be formed, the photosensitive layer transferred onto the substrate is subjected to processes such as exposure and development, and accordingly, a cured film is formed on the substrate.

According to the transfer film according to the disclosure, the effect of forming the cured film with a decreased WVTR is exhibited.

Therefore, the transfer film according to the disclosure is particularly suitable for use in forming a protective film for a touch panel as a cured film.

Hereinafter, each requirement that constitutes the transfer film according to the disclosure will be described.

<Temporary Support>

The transfer film of the disclosure includes a temporary support.

The temporary support is preferably a film and more preferably a resin film.

As the temporary support, a film which has flexibility and does not generate significant deformation, shrinkage, or stretching under the pressure or under pressure and heating can be used.

Examples of such a film include a polyethylene terephthalate film, a cellulose triacetate film, a polystyrene film, a polyimide film, and a polycarbonate film.

Among these, a biaxial stretching polyethylene terephthalate film is particularly preferable.

A thickness of the temporary support is not particularly limited, and is preferably 5 µm to 200 µm. The thickness of the temporary support is particularly preferably 10 µm to 150 µm from a viewpoint of handleability and versatility.

<Photosensitive Layer>

The transfer film according to the disclosure includes a photosensitive layer.

The photosensitive layer according to the disclosure includes the polymer A containing the constitutional unit A1, the constitutional unit B1, and the constitutional unit C1, a radically polymerizable compound, and a photopolymerization initiator, the content of the constitutional unit A1 is 10% by mass or more with respect to a total mass of the polymer A, the content of the constitutional unit B1 is 15% by mass or more with respect to a total mass of the polymer A, and the glass transition temperature (Tg) of a homopolymer of a monomer having an alicyclic structure that forms the constitutional unit B1 is 120° C. or higher.

The photosensitive layer of the disclosure is preferably a so-called negative photosensitive layer that is cured by exposure.

In addition, the photosensitive layer of the disclosure is preferably transparent.

[Constitutional Unit A1]

The polymer A used in the disclosure includes a constitutional unit (the constitutional unit A1) represented by Formula A1.

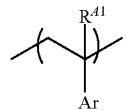

Formula A1

In Formula A1, Ar represents a phenyl group or a naphthyl group and $R^{A1}$ represents a hydrogen atom or an alkyl group.

In Formula A1, Ar may have a substituent, but is preferably an unsubstituted phenyl group or an unsubstituted naphthyl group. Examples of the substituent which the phenyl group or the naphthyl group may include an alkyl group, an alkoxy group, an aryl group, a halogen atom, and a hydroxy group. In addition, the phenyl group or the naphthyl group may have a plurality of substituents.

In Formula A1, $R^{A1}$ is preferably a hydrogen atom. In a case where $R^{A1}$ represents an alkyl group, an alkyl group having 1 to 4 carbon atoms is preferable, and a methyl group is more preferable.

The constitutional unit represented by Formula A1 is introduced into the polymer A by using, for example, a monomer represented by Formula A2 as a monomer used in the production of the polymer A.

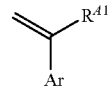

Formula A2

In Formula A2, Ar and $R^{A1}$ have the same meanings as Ar and $R^{A1}$ in Formula A1, respectively, and the preferred embodiments are also the same.

Specific examples of the monomer represented by Formula A2 include styrene, α-methylstyrene, 1-vinylnaphthalene, 2-vinylnaphthalene, 4-hydroxystyrene, 4-bromostyrene, and 4-methoxystyrene, and styrene is particularly preferable.

Specific examples of the constitutional unit represented by Formula A1 are shown below, but the constitutional unit represented by Formula A1 is not limited thereto.

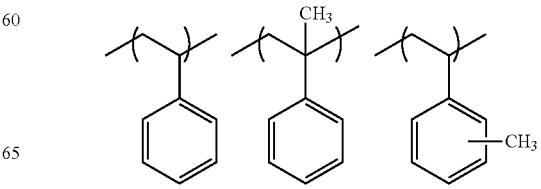

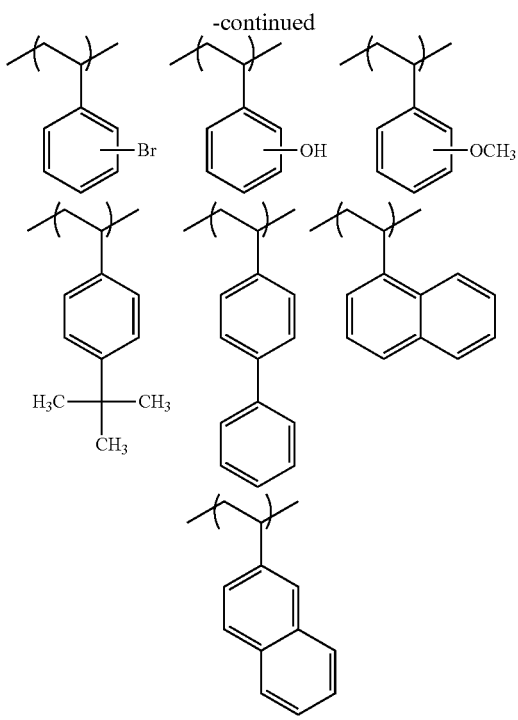

From a viewpoint of decreasing the WVTR, the content of the constitutional unit represented by Formula A1 with respect to a total mass of the polymer A is 10% by mass or more, more preferably 15% by mass or more, and more preferably 20% by mass or more. The upper limit is not particularly limited and can be 50% by mass or less.

The polymer A may contain a plurality of types of the constitutional unit represented by Formula A1. In that case, the content is a total value of the contents of the plurality of constitutional units represented by Formula A1.

[Constitutional Unit B1]

The polymer A of the disclosure is a monomer having a glass transition temperature of a homopolymer of 120° C. or higher, and includes a constitutional unit (the constitutional unit B1) derived from a monomer having an alicyclic structure.

The alicyclic structure forming the constitutional unit B1 is not particularly limited, may be a hydrocarbon cyclic structure or a heterocyclic structure containing a hetero atom, and is preferably a hydrocarbon cyclic structure containing no hetero atom. In a case where a hetero atom is contained, examples of the hetero atom include an oxygen atom, a nitrogen atom, and a sulfur atom.

An aromatic cyclic structure may be further bonded to the alicyclic structure, and the alicyclic structure may be a condensed polycyclic structure.

The alicyclic structure that forms the constitutional unit B1 is preferably a 5- to 30-membered ring and more preferably a 5- to 20-membered ring.

In addition, the constitutional unit B1 may have a plurality of alicyclic structures.

A constitutional unit having an alicyclic structure and the Tg of 120° C. or higher and including a radically polymerizable group corresponds to the constitutional unit B1 and does not correspond to the constitutional unit C1 which will be described later.

—Monomer Having Alicyclic Structure—

The monomer having an alicyclic structure that forms the constitutional unit B1 is not particularly limited as long as the homopolymer has a Tg of 120° C. or higher, and examples thereof include a (meth)acrylic acid ester compound having an alicyclic structure and an N-substituted maleimide compound.

Examples of the monomer having an alicyclic structure that forms the constitutional unit B1 include constitutional units derived from dicyclopentanyl methacrylate (Tg: 175° C.), dicyclopentanyl acrylate (Tg: 120° C.), isobornyl methacrylate (Tg: 173° C.), 1-adamantyl methacrylate (Tg: 250° C.), 1-adamantyl acrylate (Tg: 153° C.), and N-phenylmaleimide (Tg: 276° C.). In a case where the polymer A contains the constitutional unit derived from the above compound, the tackiness (pressure-sensitive adhesiveness) of the surface of the photosensitive layer on the temporary support is reduced, a friction force with a roll in contact with the photosensitive layer is reduced, and therefore, generation of wrinkles on the surface of the photosensitive layer can be prevented.

In the specific examples, the value of Tg is a value of Tg in a case where each monomer is a homopolymer.

In addition, the Tg of the homopolymer of the monomer having an alicyclic structure that forms the constitutional unit B1 is 120° C. or higher, preferably 150° C. or higher, and more preferably 170° C. or higher. In a case where Tg is in the above range, the tackiness of the surface of the photosensitive layer can be reduced. An upper limit of the glass transition temperature is not particularly limited, and is preferably 250° C. or lower.

After producing a homopolymer having a weight-average molecular weight of 10,000 or more of a monomer having an alicyclic structure that forms the constitutional unit B1, the glass transition temperature (Tg) of the homopolymer can be measured by a method described in JIS K7121 with a differential scanning calorimeter (DSC) or the like. Although the glass transition temperature (Tg) changes depending on the molecular weight, in a case where the weight-average molecular weight is 10,000 or more, the change in Tg due to the molecular weight is negligible.

The content of the constitutional unit B1 is 15% by mass or more, preferably 15% by mass to 70% by mass, and more preferably 20% by mass to 60% by mass, and even more preferably 25% by mass to 50% by mass, with respect to a total mass of the polymer A.

In a case where the content of the constitutional unit B1 is 15% by mass or more, the tackiness of the surface of the photosensitive layer is reduced and wrinkles are hardly generated on the surface of the photosensitive layer in a case of transporting the transfer film having the photosensitive layer formed on the temporary support. The content of the constitutional unit B1 is preferably 70% by mass or less, since the transferability in a case of transferring the transfer film to the substrate is improved, the cured film is prevented from being brittle, and the resistance to bending is improved.

The polymer A may contain a plurality of types of the constitutional units represented by the formula B1. In that case, the content is a total value of the contents of the plurality of constitutional units represented by Formula B1.

[Constitutional Unit C1]

The polymer A of the disclosure preferably includes a constitutional unit including a radically polymerizable group (constitutional unit C1).

The radically polymerizable group is not particularly limited, and is preferably an ethylenically unsaturated group, more preferably a (meth)acryloyl group or a vinylphenyl group, and even more preferably a (meth)acryloxy group.

As the constitutional unit C1, a unit represented by Formula C2 (hereinafter, also referred to as "constitutional unit C2") is preferable.

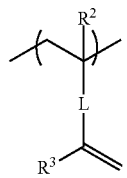

Formula C2

In Formula C2, $R^2$ and $R^3$ each independently represent a hydrogen atom or an alkyl group and L represents a divalent linking group.

The number of carbon atoms in the alkyl group represented by $R^2$ and $R^3$ is each independently preferably 1 to 3, more preferably 1 or 2, and particularly preferably 1.

The divalent linking group represented by L is preferably one group selected from the group consisting of a carbonyl group (that is, —C(═O)— group), an oxygen atom (that is, —O— group), an alkylene group, and an arylene group, or a group formed by linking two or more groups selected from the above group.

The alkylene group or the arylene group may each be substituted with a substituent (for example, a hydroxyl group other than a primary hydroxyl group, a halogen atom, or the like).

The divalent linking group represented by L may have a branched structure.

The number of carbon atoms in the divalent linking group represented by L is preferably 1 to 30, more preferably 1 to 20, and even more preferably 2 to 10.

As the divalent linking group represented by L, a group represented by any of Formulae L-1 to L-6 is particularly preferred.

Formula L-1

*1
|
CO
|
O
|
CH₂
|
CHOH
|
CH₂
|
O
|
CO
|
*2

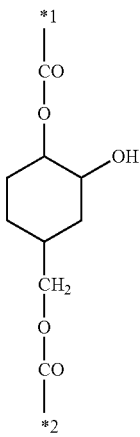

Formula L-2

Formula L-3

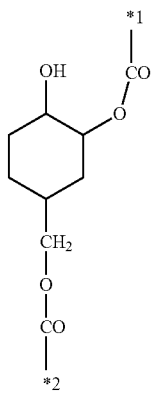

Formula L-4

*1
|
CO
|
O
|
CO
|
*2

Formula L-5

*1
|
(CH₂)$_n$
|
O
|
CO
|
NH
|
(CH₂)$_m$
|
O
|
CO
|
*2

Formula L-6

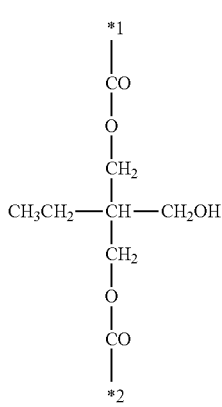

In each of the above groups, *1 represents a bonding site with a carbon atom contained in a main chain in Formula C2, and *2 represents a bonding site with a carbon atom forming a double bond in Formula C2.

In addition, in Formula L-5, n and m each independently represent an integer of 1 to 6.

Examples of the constitutional unit C1 include a constitutional unit in which an epoxy group-containing monomer is added to a (meth)acrylic acid unit, a constitutional unit in which an isocyanate group-containing monomer is added to a hydroxyl group-containing monomer unit, and the like.

The epoxy group-containing monomer is preferably an epoxy group-containing (meth)acrylate having 5 to 24 carbon atoms in total, more preferably an epoxy group-containing (meth)acrylate having 5 to 12 carbon atoms in total, and particularly preferably glycidyl (meth)acrylate or 3,4-epoxycyclohexylmethyl (meth)acrylate.

The hydroxyl group-containing monomer for forming the hydroxyl group-containing monomer unit is preferably hydroxyalkyl (meth)acrylate having 4 to 24 carbon atoms in total, hydroxyalkyl (meth)acrylate having 4 to 12 carbon atoms in total, and particularly preferably hydroxyethyl (meth)acrylate.

Here, the "(meth)acrylic acid unit" means a constitutional unit derived from (meth)acrylic acid.

In the same manner as described above, in this specification, the term "unit" immediately after a monomer name (for example, "hydroxyl group-containing monomer unit") means a constitutional unit derived from the monomer (for example, a hydroxyl group-containing monomer).

More specific examples of the constitutional unit C1 include a constitutional unit in which glycidyl (meth)acrylate is added to the (meth)acrylic acid unit, a constitutional unit in which (meth)acrylic acid is added to the (meth)acrylic acid unit, a constitutional unit in which 3,4-epoxycyclohexylmethyl (meth)acrylate is added to the (meth)acrylic acid unit, a constitutional unit in which 2-isocyanatoethyl (meth)acrylate is added to a hydroxyethyl (meth)acrylate unit, a constitutional unit in which 2-isocyanatoethyl (meth)acrylate is added to a hydroxybutyl (meth)acrylate unit, and a constitutional unit in which 2-isocyanatoethyl (meth)acrylate is added to a hydroxystyrene unit.

As the constitutional unit C1, a constitutional unit in which glycidyl (meth)acrylate is added to the (meth)acrylic acid unit or a constitutional unit in which 3,4-epoxycyclohexylmethyl (meth)acrylate is added to the (meth)acrylic acid unit is more preferable, and a constitutional unit in which glycidyl methacrylate is added to a methacrylic acid unit or a constitutional unit in which 3,4-epoxycyclohexylmethyl methacrylate is added to a methacrylic acid unit is particularly preferable.

From a viewpoint of satisfying both a decrease in the WVTR of the cured film and a reduction in the tackiness, the content of the constitutional unit C1 with respect to a total mass of the polymer A is preferably 5% by mass to 60% by mass and more preferably 15% by mass to 50% by mass.

The polymer A may contain a plurality of types of the constitutional units C1. In that case, the content is a total value of the contents of the plurality of constitutional units C1.

(Constitutional Unit Having Acid Group)

The polymer A preferably contains a constitutional unit having an acid group (hereinafter, also referred to as "constitutional unit D1").

The acid group is a substituent having dissociable protons, and means, for example, an acidic group such as a carboxy group, a phosphonyl group, a phosphoryl group, a sulfo group, and a boric acid group. Among these, a carboxy group, a sulfo group, or a phosphonyl group is preferable as the acid group, and a carboxy group is more preferable.

The constitutional unit having an acid group is preferably a constitutional unit derived from a monomer having an acid group such as a (meth)acrylic acid, a crotonic acid, an itaconic acid, a maleic acid, a fumaric acid, bis(methacryloxyethyl) phosphate or 2-acrylamide-2-methylpropane-sulfonic acid, more preferably a constitutional unit derived from a methacrylic acid or an acrylic acid, and even more preferably a constitutional unit derived from a methacrylic acid, from a viewpoint of reducing tackiness.

The content of the constitutional unit having an acid group with respect to a total mass of the polymer A is preferably 5% by mass to 30% by mass and more preferably 10% by mass to 25% by mass, from a viewpoint of developability and scratch resistance in a developer.

The polymer A may contain a plurality of types of the constitutional units having an acid group. In that case, the content is a total value of the contents of the plurality of constitutional units having an acid group.

In a case where the polymer A contains a constitutional unit having an acid group, an acid value of the polymer A is preferably 60 mgKOH/g or more, more preferably 60 mgKOH/g to 200 mgKOH/g, even more preferably 60 mgKOH/g to 150 mgKOH/g, and particularly preferably 60 mgKOH/g to 110 mgKOH/g.

As the acid value, a value of the theoretical acid value calculated by a calculation method disclosed in the paragraph 0063 of JP2004-149806A or paragraph 0070 of JP2012-211228A can be used.

[Other Constitutional Units]

The polymer A may contain other constitutional units other than the constitutional units described above.

Other constitutional units include an alkyl (meth)acrylate unit having neither a radically polymerizable group nor an acid group.

A total number of carbon atoms in the alkyl (meth)acrylate unit as the other constituent unit is preferably 4 to 24 and more preferably 4 to 20.

The alkyl moiety in the alkyl (meth)acrylate unit may have at least one structure selected from the group consisting of a cyclic structure and a branched structure.

<Properties of Polymer A>
[Weight-Average Molecular Weight of Polymer A]

The weight-average molecular weight (Mw) of the polymer A is not particularly limited, and is preferably 10,000 to 200,000, more preferably 10,000 to 100,000, and particularly preferably 10,000 to 60,000, from viewpoints of developability, further decrease in the WVTR of a cured film, and reduction of tackiness.

In the disclosure, the weight-average molecular weight (Mw) can be measured by gel permeation chromatography (GPC) under the following conditions. The calibration curve is drawn from 8 samples of "standard sample TSK standard, polystyrene" manufactured by Tosoh Corporation: "F-40", "F-20", "F-4", "F-1", "A-5000", "A-2500", "A-1000", and "n-propylbenzene".

—Conditions—
GPC: HLC (registered trademark)-8020GPC (manufactured by Tosoh Corporation)
Column: TSKgel (registered trademark), three Super Multipore HZ-H (manufactured by Tosoh Corporation, 4.6 mm ID×15 cm)
Eluent: THF (tetrahydrofuran)
Sample Concentration: 0.45% by mass
Flow rate: 0.35 ml/min
Sample injected amount: 10 μl
Measurement temperature: 40° C.
Detector: Differential refractometer (RI)

[Content]

The content of the polymer A in the photosensitive layer of the disclosure is not particularly limited.

The content of the polymer A is preferably 10% by mass to 95% by mass, more preferably 20% by mass to 80% by mass, and particularly preferably from 30% by mass to 70% by mass, with respect to a total mass of the photosensitive layer.

The photosensitive layer of the disclosure may contain another polymer other than the polymer A (for example, an acrylic resin, a polysiloxane resin, a polystyrene resin, a polyimide resin, and the like).

In the photosensitive layer of the disclosure, the content of the polymer A with respect to a total mass the polymer to be contained is preferably 60% by mass to 100% by mass, more preferably 80% by mass to 100% by mass, and particularly preferably 90% by mass to 100% by weight.

SPECIFIC EXAMPLES

Specific examples of the polymer A used in the disclosure include polymers P-1 to P-17 in examples which will be described later.

<Radical Polymerization Initiator>

The photosensitive layer of the disclosure contains at least one radical polymerization initiator.

The radical polymerization initiator is not particularly limited and a well-known radical polymerization initiator can be used.

The radical polymerization initiator is preferably a photo radical polymerization initiator.

Examples of the radical polymerization initiator include
a radical polymerization initiator having an oxime ester structure (hereinafter, also referred to as an "oxime-based polymerization initiator"),
a radical polymerization initiator having an α-aminoalkylphenone structure (hereinafter, also referred to as an "α-aminoalkylphenone-based polymerization initiator"),
a radical polymerization initiator having an α-hydroxyalkylphenone structure (hereinafter, also referred to as an "α-hydroxyalkylphenone-based polymerization initiator"), and
a radical polymerization initiator having an acylphosphine oxide structure (hereinafter, also referred to as an "acylphosphine oxide-based polymerization initiator").

The radical polymerization initiator preferably includes at least one kind selected from the group consisting of the oxime-based polymerization initiator, the α-aminoalkylphenone-based polymerization initiator, and the α-hydroxyalkylphenone-based polymerization initiator, and more preferably includes at least one kind selected from the group consisting of the oxime-based polymerization initiator, the α-aminoalkylphenone-based polymerization initiator.

In addition, as the radical polymerization initiator, for example, polymerization initiators disclosed in paragraphs 0031 to 0042 of JP2011-095716A and paragraphs 0064 to 0081 of JP2015-014783A may be used.

Examples of a commercially available product of the radical polymerization initiator include 1,2-octanedione, 1-[4-(phenylthio)-, 2-(O-benzoyloxime)] (product name: IRGACURE (registered trademark) OXE-01, manufactured by BASF Japan Ltd.), ethanone, 1-[9-ethyl-6-(2-methylbenzoyl)-9H-carbazol-3-yl]-, 1-(O-acetyloxime) (product name: IRGACURE OXE-02, manufactured by BASF Japan Ltd.), 2-(dimethylamino)-2-[(4-methylphenyl)methyl]-1-[4-(4-morpholinyl)phenyl]-1-butanone (product name: IRGACURE 379EG manufactured by BASF Japan Ltd.), 2-methyl-1-(4-methylthiophenyl)-2-morpholinopropan-1-one (product name: IRGACURE 907, manufactured by BASF Japan Ltd.), 2-hydroxy-1-{4-[4-(2-hydroxy-2-methylpropionyl)-benzyl]phenyl}-2-methyl-propan-1-one (product name: IRGACURE 127, manufactured by BASF Japan Ltd.), 2-benzyl-2-dimethylamino-1-(4-morpholinophenyl)-butanone-1 (product name: IRGACURE 369, manufactured by BASF Japan Ltd.), 2-hydroxy-2-methyl-1-phenylpropan-1-one (product name: IRGACURE 1173, manufactured by BASF Japan Ltd.), 1-hydroxy cyclohexyl phenyl ketone (product name: IRGACURE 184, manufactured by BASF Japan Ltd.), 2,2-dimethoxy-1,2-diphenylethan-1-one (product name: IRGACURE 651, manufactured by BASF Japan Ltd.), and a product name of an oxime ester type (product name: Lunar 6, manufactured by DKSH Management Ltd.).

[Content]

A content of the radical polymerization initiator in the photosensitive layer of the disclosure is not particularly limited.

The photosensitive layer of the disclosure may include one kind of radical polymerization initiator alone, or may use two or more kinds thereof in combination.

The content of the radical polymerization initiator is preferably 0.1% by mass or more, more preferably 0.5% by mass or more, and even more preferably 1.0% by mass or more with respect to a total mass of the photosensitive layer.

In addition, the content of the radical polymerization initiator is preferably equal to or smaller than 10% by mass and more preferably equal to or smaller than 5% by mass, with respect to a total mass of the photosensitive layer.

<Radically Polymerizable Compound>

The photosensitive layer of the disclosure includes at least one radically polymerizable compound from a viewpoint of further improving hardness of the cured film.

The radically polymerizable compound preferably includes a di- or higher functional radically polymerizable compound.

Here, the radically polymerizable compound means a monomer having a radically polymerizable group in one molecule, and the di- or higher functional radically polymerizable compound means a monomer having two or more radically polymerizable groups in one molecule.

Among the compounds having a radically polymerizable group, those corresponding to the polymer A do not correspond to the "radically polymerizable compound" in the disclosure.

As the radically polymerizable group, an ethylenically unsaturated group (that is, a group having an ethylenic double bond) is preferable, and a (meth)acryloyl group is more preferable.

As the radically polymerizable compound, (meth)acrylate is preferable.

The photosensitive layer of the disclosure particularly preferably includes a difunctional radically polymerizable compound (preferably, a difunctional (meth)acrylate) and a tri- or higher functional radically polymerizable compound (preferably, tri- or higher functional (meth)acrylate), from a viewpoint of improving the decrease in WVTR of the cured film.

In addition, in a case where the photosensitive layer of the disclosure contains a tri- or higher functional (meth)acrylate, the crosslink density of the cured film to be obtained is increased and the WVTR is more easily decreased.

[Difunctional Radically polymerizable Compound Having Cyclic Structure]

From a viewpoint of decreasing the WVTR of the cured film, the photosensitive layer of the disclosure preferably includes a difunctional radically polymerizable compound having a cyclic structure as the di- or higher functional radically polymerizable compound.

The cyclic structure may be an alicyclic structure or an aromatic cyclic structure, and is preferably an alicyclic structure.

Examples of the difunctional radically polymerizable compound having an alicyclic structure include tricyclodecanediol di(meth)acrylate, and tricyclodecane dimethanol di(meth)acrylate is preferable.

Examples of the difunctional radically polymerizable compound having an aromatic cyclic structure include a difunctional radically polymerizable compound having a bisphenol structure (bisphenol A structure, bisphenol F structure, or the like), and a di(meth)acrylate compound having a bisphenol structure (for example, alkylene oxide-modified bisphenol A di(meth)acrylate) is preferred.

As the difunctional radically polymerizable compound having an alicyclic structure, a commercially available product may be used. Examples of the commercially available product include tricyclodecane dimethanol diacrylate (A-DCP manufactured by Shin-Nakamura Chemical Co., Ltd.) and tricyclodecane dimethanol dimethacrylate (DCP manufactured by Shin-Nakamura Chemical Co., Ltd.).

[Other Difunctional Radically polymerizable Compound]

The other difunctional radically polymerizable compound is not particularly limited and can be suitably selected from well-known compounds.

Examples of the other difunctional radically polymerizable compound include alkylene diol di(meth)acrylates such as 1,9-nonanediol di(meth)acrylate and 1,6-hexanediol di(meth)acrylate.

As the other difunctional radically polymerizable compound, a commercially available product may be used. Examples of the commercially available product include 1,9-nonanediol diacrylate (A-NOD-N, Shin-Nakamura Chemical Co., Ltd.) and 1,6-hexanediol diacrylate (A-HDN, manufactured by Shin-Nakamura Chemical Co., Ltd.).

[Radically Polymerizable Compound Having Tri- or Higher Functional Group]

The tri- or higher functional radically polymerizable compound is not particularly limited and can be suitably selected from well-known compounds.

Examples of the tri- or higher functional radically polymerizable compound include dipentaerythritol (tri/tetra/penta/hexa) (meth)acrylate, pentaerythritol (tri/tetra) (meth)acrylate, trimethylolpropane tri(meth)acrylate, ditrimethylolpropane tetra(meth)acrylate, isocyanuric acid tri(meth)acrylate, and a (meth)acrylate compound of a glycerin tri(meth)acrylate skeleton.

Here, the "(tri/tetra/penta/hexa) (meth)acrylate" has a concept including tri(meth)acrylate, tetra(meth)acrylate, penta(meth)acrylate, and hexa(meth)acrylate, and the "(tri/tetra) (meth)acrylate" has a concept including tri(meth)acrylate and tetra(meth)acrylate.

Examples of the radically polymerizable compound include a caprolactone-modified compound of a (meth)acrylate compound (KAYARAD (registered trademark) DPCA-20 manufactured by Nippon Kayaku Co., Ltd., A-9300-1CL manufactured by Shin-Nakamura Chemical Co., Ltd.), an alkylene oxide-modified compound of a (meth)acrylate compound (KAYARAD RP-1040 manufactured by Nippon Kayaku Co., Ltd., ATM-35E, A-9300 manufactured by Shin-Nakamura Chemical Co., Ltd., EBE-CRYL (registered trademark) 135 manufactured by Daicel-Allnex Ltd.), and ethoxylated glycerin triacrylate (A-GLY-9E manufactured by Shin-Nakamura Chemical Co., Ltd.).

[Urethane (Meth)Acrylate]

As the radically polymerizable compound, urethane (meth)acrylate (preferably tri- or higher functional urethane (meth)acrylate) is also used.

Examples of the tri- or higher functional urethane (meth)acrylate include 8UX-015A (manufactured by Taisei Fine Chemical Co., Ltd.), UA-32P (manufactured by Shin-Nakamura Chemical Co., Ltd.), and UA-1100H (manufactured by Shin-Nakamura Chemical Co., Ltd.).

(Radically polymerizable Compound Having Acid Group)

In addition, the radically polymerizable compound preferably contains a radically polymerizable compound having an acid group from a viewpoint of improving alkali solubility (that is, improving developability).

Examples of the acid group include a phosphoric acid group, a sulfonic acid group, and a carboxy group, and a carboxyl group is preferable.

Examples of the radically polymerizable compound including the acid group include a tri- or tetra-functional radically polymerizable compound including the acid group (component obtained by introducing a carboxy acid group to pentaerythritol tri- and tetra-acrylate [PETA] skeleton (acid value=80 mgKOH/g to 120 mgKOH/g)), and a penta- to hexa-functional radically polymerizable compound including the acid group (component obtained by introducing a carboxyl group to dipentaerythritol penta- and hexa-acrylate [DPHA] skeleton (acid value=25 to 70 mgKOH/g)).

The tri- or higher functional radically polymerizable compound including the acid group may be used in combination with the difunctional radically polymerizable compound including the acid group, as necessary.

As the radically polymerizable compound including the acid group, at least one kind selected from the group consisting of di- or higher functional radically polymerizable compound including carboxyl group and a carboxylic acid anhydride thereof is preferable.

The di- or higher functional radically polymerizable compound including a carboxyl group is not particularly limited and can be suitably selected from well-known compounds.

For example, as the di- or higher functional radically polymerizable compound including a carboxyl group, ARONIX (registered trademark) TO-2349 (manufactured by Toagosei Co., Ltd.), ARONIX M-520 (manufactured by Toagosei Co., Ltd.), or ARONIX M-510 (manufactured by Toagosei Co., Ltd.) can be preferably used.

The radically polymerizable compound including the acid group is also preferably a polymerizable compound including an acid group disclosed in paragraphs 0025 to 0030 of JP2004-239942A. The content of this publication is incorporated in this specification.

(Molecular Weight)

A molecular weight (in the case of having a distribution, the weight-average molecular weight) of the radically polymerizable compound that can be included in the photosensitive layer of the disclosure is preferably 200 to 3,000, more preferably 250 to 2,600, and even more preferably 280 to 2,200.

Among all of the radically polymerizable compounds included in the photosensitive layer of the disclosure, the molecular weight of the compound having the smallest molecular weight is preferably 250 or more, more preferably 280 or more, and even more preferably 300 or more.

A percentage of the content of the radically polymerizable compound having a molecular weight of 300 or less, among all of the radically polymerizable compound included in the photosensitive layer of the disclosure is preferably 30% by mass or less, more preferably 25% by mass or less, and even more preferably 20% by mass or less, with respect to all of the radically polymerizable compounds included in the photosensitive layer.

[Content]

The content of the radically polymerizable compound is preferably 1% by mass to 70% by mass, more preferably 10% by mass to 70% by mass, even more preferably 20% by mass to 60% by mass, and particularly preferably 20% by mass to 50% by mass, with respect to a total mass of the photosensitive layer.

In addition, in a case where the photosensitive layer according to the disclosure includes a difunctional radically polymerizable compound and a tri- or higher functional radically polymerizable compound, the content of the difunctional radically polymerizable compound is preferably 10% by mass to 90% by mass, more preferably 20% by mass to 85% by mass, and even more preferably 30% by mass to 80% by mass, with respect to all of the radically polymerizable compounds included in the photosensitive layer.

In this case, the content of the tri- or higher functional radically polymerizable compound is preferably 10% by mass to 90% by mass, more preferably 15% by mass to 80% by mass, and even more preferably 20% by mass to 70% by mass, with respect to all of the radically polymerizable compounds included in the photosensitive layer.

In this case, the content of the di- or higher functional radically polymerizable compound is preferably 50% by mass or more and less than 100% by mass, more preferably 60% by mass to 95% by mass, and particularly preferably 70% by mass to 95% by mass, with respect to a total mass of the difunctional radically polymerizable compound and the tri- or higher functional radically polymerizable compound.

In addition, in a case where the photosensitive layer of the disclosure includes a di- or higher functional radically polymerizable compound, the photosensitive layer may further include a monofunctional radically polymerizable compound.

However, in a case where the photosensitive layer of the disclosure includes a di- or higher functional radically polymerizable compound, the di- or higher functional radically polymerizable compound is preferably the main component in the radically polymerizable compound contained in the photosensitive layer.

Specifically, in a case where the photosensitive layer of the disclosure includes di- or higher functional radically polymerizable compound, the content of the di- or higher functional radically polymerizable compound is preferably 60% by mass to 100% by mass, more preferably 80% by mass to 100% by mass, and particularly preferably 90% by mass to 100% by mass with respect to a total mass of the radically polymerizable compound included in the photosensitive layer.

In a case where the photosensitive layer of the disclosure includes the radically polymerizable compound including an acid group (preferably, di- or higher functional radically polymerizable compound including a carboxyl group or a carboxylic acid anhydride thereof), the content of the radically polymerizable compound including the acid group is preferably 1% by mass to 50% by mass, more preferably 1% by mass to 20% by mass, and even more preferably 1% by mass to 10% by mass, with respect to a total mass of the photosensitive layer.

In the photosensitive layer of the disclosure, a content mass ratio of the radically polymerizable compound to the polymer A (radically polymerizable compound/polymer A) is preferably 1.5 or less, more preferably 0.1 to 1.5, even more preferably 0.5 to 1.2, and still preferably 0.7 to 1.0.

<Thermal Crosslinking Compound>

It is preferable that the photosensitive layer of the disclosure further includes a thermal crosslinking compound.

The thermal crosslinking compound is a compound having at least one thermal crosslinking group.

In the disclosure, the thermal crosslinking group means a group other than a radically polymerizable group, which forms a bond with the polymer A or another component (including a bond between thermal crosslinking compounds) by the effect of heat, and is more preferably a group that forms a bond with the polymer A.

In a case where the photosensitive layer of the disclosure includes the thermal crosslinking compound, the photosensitive layer has not only photosensitivity (that is, photocuring properties) but also thermosetting properties.

In a case where the photosensitive layer of the disclosure has both photocuring properties and thermosetting properties, a cured film having excellent hardness can be formed by photocuring, and the hardness of the cured film can be further improved and the WVTR of the cured film can be further decreased by thermal curing after forming the cured film.

From a viewpoint of further decreasing the WVTR of the cured film, the thermal crosslinking group of the thermal crosslinking compound is preferably at least one kind selected from the group consisting of an epoxy group, an oxetanyl group, an isocyanate group, an epoxy group, a ketene group, a blocked isocyanate group, and a blocked ketene group, more preferably an epoxy group or a blocked isocyanate group, and even more preferably a blocked isocyanate group.

That is, the thermal crosslinking compound particularly preferably contain on ore more thermal crosslinking groups which are at least one kind selected from the group consisting of an epoxy group, an oxetanyl group, an isocyanate group, a ketene group, a blocked isocyanate group, and a blocked ketene group in one molecule. An upper limit of the number of thermal crosslinking groups in one molecule is not particularly limited, and the number of thermal crosslinking groups in one molecule can be, for example, 30 or less, and more preferably 10 or less.

The compound having a thermal crosslinking group may have a hydrophilic group in one molecule.

In a case where the compound having thermal crosslinking properties has a hydrophilic group in one molecule, developability is improved.

The thermal crosslinking compound having a hydrophilic group in one molecule is not particularly limited, and a known compound can be used.

A method for synthesizing the thermal crosslinking compound having a hydrophilic group in one molecule is not particularly limited.

As the hydrophilic group in the thermal crosslinking compound having a hydrophilic group in one molecule, a nonionic hydrophilic group or a cationic hydrophilic group is preferable.

The nonionic hydrophilic group is not particularly limited, and, for example, a group having a structure in which ethylene oxide or propylene oxide is added to a hydroxyl group of any one alcohol of methanol, ethanol, butanol, ethylene glycol, and diethylene glycol.

The compound having thermal crosslinking properties may be a compound that reacts with an acid group or a hydroxyl group by heat.

A compound including a thermal crosslinking group, which is a compound that reacts with an acid group or a hydroxyl group by heat, reacts with an acid group or a hydroxyl group existing in a system (for example, an acid group or a hydroxyl group in a (meth)acrylic resin as another polymer). Accordingly, the polarity in the system is reduced, so that the hydrophilicity is reduced and the WVTR is further decreased.

As the compound having a thermal crosslinking group that is a compound that reacts with an acid group or a hydroxyl group by heat, a compound having a group that is temporarily inactivated by a blocking agent (for example, a blocked isocyanate group, a blocked ketene group, or the like) as a thermal reactive group and capable of reacting with an acid by dissociation of a group derived from a blocking agent at a predetermined dissociation temperature, or a compound having an epoxy group is preferable.

The compound having thermal crosslinking properties, which is a compound that reacts with an acid group or a hydroxyl group by heat, is preferably a compound having a higher reactivity with an acid after heating at a temperature higher than 25° C. than a reactivity with an acid at 25° C.

As the thermal crosslinking compound which is a compound that reacts with an acid by heat, a compound having a blocked isocyanate group (hereinafter, a "blocked isocyanate compound") or a compound having an epoxy group (hereinafter, an "epoxy compound") is particularly preferable.

[Blocked Isocyanate Compound]

The blocked isocyanate compound is preferably a compound having a structure in which an isocyanate group of an isocyanate compound (that is, compound having an isocyanate group) is protected (masked) with a blocking agent.

The blocked isocyanate compound preferably has a hydrophilic group in one molecule. The preferred aspect of the hydrophilic group is as described above.

A dissociation temperature of the blocked isocyanate compound is preferably 100° C. to 160° C. and more preferably 130° C. to 150° C.

Here, the dissociation temperature of blocked isocyanate compound is a "temperature at an endothermic peak accompanied with a deprotection reaction of blocked isocyanate, in a case where the measurement is performed by differential scanning calorimetry (DSC) analysis using a differential scanning calorimeter (manufactured by Seiko Instruments Inc., DSC6200)".

Examples of the blocking agent for forming the blocked isocyanate compound (for example, blocked isocyanate compound having a dissociation temperature at 100° C. to 160° C.) include a pyrazole compound (3,5-dimethylpyrazole, 3-methylpyrazole, 4-bromo-3,5-dimethylpyrazole, or 4-nitro-3,5-dimethylpyrazole), an active methylene compound (diester malonate (dimethyl malonate, diethyl malonate, di n-butyl malonate, di-2-ethylhexyl malonate)), a triazole compound (1,2,4-triazole), and an oxime compound (compound having a structure represented by —C(=N—OH)— in a molecule; such as formaldoxime, acetoaldoxime, acetoxime, methyl ethyl ketoxime, or cyclohexanone oxime).

Among these, from a viewpoint of preservation stability, an oxime compound or a pyrazole compound is preferable, and an oxime compound is more preferable.

A commercially available product may be used as the blocked isocyanate compound.

Examples of commercially available product of the blocked isocyanate compounds include TAKENATE (registered trademark) B870N (manufactured by Mitsui Chemicals, Inc.), which is a methyl ethyl ketone oxime blocked product of isophorone diisocyanate, and DURANATE (registered trademark) MF-K60B, TPA-B80E, and X3071.04 (all manufactured by Asahi Kasei Chemicals Corporation) which are hexamethylene diisocyanate-based blocked isocyanate compounds.

(Epoxy Compound)

The epoxy group included in the epoxy compound may be a glycidyl group or an alicyclic epoxy group.

The epoxy compound is not particularly limited, and a well-known compound can be used.

As the epoxy compound, a compound disclosed in paragraphs 0096 to 0098 of JP2015-135396A can be preferably used, and the content of this publication is incorporated in the specification.

As an example of the epoxy compound, EPDX-MK R151 (manufactured by Printec Co.) can be used.

(Radically Polymerizable Group)

The thermal crosslinking compound preferably has a radically polymerizable group.

In addition, the compound containing a thermal crosslinking group and a radically polymerizable group does not correspond to the above-mentioned radically polymerizable compound, but corresponds to a thermal crosslinking compound.

In a case where the thermal crosslinking compound has a radically polymerizable group, a transfer film having more excellent scratch resistance in a developer can be easily obtained. It is surmised that this is because the radically polymerizable group in the thermal crosslinking compound and the radically polymerizable compound or the polymer A contained in the photosensitive layer are further polymerized in a case of exposure, so that surface hardness of the photosensitive layer in a case of development is improved. In addition, it is surmised that a cured film having a further decreased WVTR can be obtained by a reaction of the thermal crosslinking group incorporated in the polymer after exposure in heating (post baking) or the like after development.

The radically polymerizable group included in the thermal crosslinking compound is not particularly limited, and a well-known radically polymerizable group can be used, and is preferably an ethylenically unsaturated group and more preferably, for example, a (meth)acryloyl group or a vinylphenyl group. Among these, as the radically polymerizable group, an ethylenically unsaturated group is preferable, and a (meth)acryloxy group is more preferable, from viewpoints of surface shape of the surface of the cured film to be obtained, a development speed, and reactivity.

In a case where the thermal crosslinking compound has a radically polymerizable group, an amount of mol of the radically polymerizable group contained in the thermal crosslinking compound is preferably the amount equal to or smaller than an amount of mol of the thermal crosslinking group, from a viewpoint of further easily decreasing the WVTR, it is more preferable that the thermal crosslinking group:radically polymerizable group (molar ratio) is 1:1 to 10:1, and it is even more preferable that the thermal crosslinking group:radically polymerizable group (molar ratio) is 1:1: to 5:1.

The thermal crosslinking compound having a radically polymerizable group is not particularly limited, and for example, the following compounds are used.

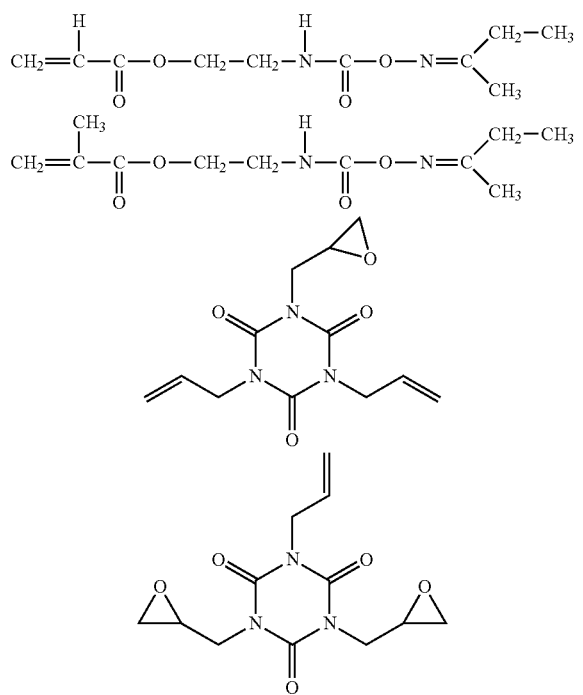

As the compound having a radically polymerizable group, a commercially available product may be used, and examples of the commercially available product include KARENZ AOI-BM, KARENZ MOI-BM (both manufactured by Showa Denko KK), and DA-MGIC, MA-DGIC (both manufactured by Shikoku Chemicals Co., Ltd.).

(Molecular Weight)

The molecular weight of the thermal crosslinking compound is preferably 1,000 or less from a viewpoint of a development speed and thermal reactivity.

[Content]

In a case where the photosensitive layer of the disclosure includes the thermal crosslinking compound, a content of the thermal crosslinking compound is preferably 1% by mass to 50% by mass and more preferably 5% by mass to 30% by mass, with respect to a total mass of the photosensitive layer.

<<Other Components>>

The photosensitive layer of the disclosure may include a component other than the components described above.

Examples of the other components include a metal oxidation inhibitor which will be described later, a surfactant disclosed in paragraph 0017 of JP4502784B and paragraphs 0060 to 0071 of JP2009-237362A, a well-known fluorine-based surfactant, a thermal polymerization inhibitor disclosed in paragraph 0018 of JP4502784B, and other additives disclosed in paragraphs 0058 to 0071 of JP2000-310706A.

The photosensitive layer of the disclosure preferably includes MEGAFACE F-551 (manufactured by DIC Corporation) which is a fluorine-based surfactant as the other component.

The photosensitive layer of the disclosure may include at least one kind of particles (for example, metal oxide particles) as the other component, in order to adjust a refractive index or light transmittance.

The metal of the metal oxide particles also includes semimetal such as B, Si, Ge, As, Sb, or Te. From a viewpoint of transparency of the cured film, an average primary particle diameter of the particles (for example, metal oxide particles) is preferably 1 to 200 nm and more preferably 3 to 80 nm. The average primary particle diameter is calculated by measuring particle diameters of 200 random particles using an electron microscope and averaging the measured result. In a case where the shape of the particle is not a spherical shape, the longest side is set as the particle diameter.

The content of the particles is preferably 0% by mass to 35% by mass, more preferably 0% by mass to 10% by mass, even more preferably 0% by mass to 5% by mass, still more preferably 0% by mass to 1% by mass, and particularly preferably 0% by mass (that is, the photosensitive layer includes no particles), with respect to a total mass of the photosensitive layer.

In addition, the photosensitive layer of the disclosure may include a small amount of colorant (pigment, dye, and the like) as the other component, but it is preferable that a colorant is not substantially included, from a viewpoint of transparency.

Specifically, a content of the colorant in the photosensitive layer of the disclosure is preferably smaller than 1% by mass and more preferably smaller than 0.1% by mass with respect to a total mass of the photosensitive layer.

In addition, the photosensitive layer of the disclosure may further include a solvent. As a case where the photosensitive layer includes the solvent, a case where the solvent remains in the photosensitive layer even after drying, in a case of forming the photosensitive layer by applying and drying a photosensitive composition including the solvent and the other components to be included in the photosensitive layer, is used, for example.

[Solvent]

As the solvent, a solvent normally used can be used without particular limitations.

The solvent is preferably an organic solvent.

Examples of the organic solvent include methyl ethyl ketone, propylene glycol monomethyl ether, propylene glycol monomethyl ether acetate (another name: 1-methoxy-2-propyl acetate), diethylene glycol ethyl methyl ether, cyclohexanone, methyl isobutyl ketone, ethyl lactate, methyl lactate, caprolactam, n-propanol, and 2-propanol. The photosensitive layer of the disclosure may include a mixed solvent which is a mixture of these compounds.

As the solvent, a mixed solvent of methyl ethyl ketone and propylene glycol monomethyl ether acetate, a mixed solvent of diethylene glycol ethyl methyl ether and propylene glycol monomethyl ether acetate, or a mixed solvent of methyl ethyl ketone, propylene glycol monomethyl ether, and propylene glycol monomethyl ether acetate is preferably used.

In a case where the photosensitive layer of the disclosure includes the solvent, a content of the solvent is preferably 10% by mass or less, more preferably 5% by mass or less, and particularly preferably 3% by mass or less with respect to a total mass of the photosensitive layer. A lower limit of the content of the solvent is not particularly limited, and may be 0% by mass.

<Properties of Photosensitive Layer>

(Refractive Index)

A refractive index of the photosensitive layer is preferably 1.47 to 1.56 and more preferably from 1.50 to 1.56.

The method for controlling the refractive index of the photosensitive layer is not particularly limited.

Examples of a method for controlling the refractive index of the photosensitive layer include a method for selecting the polymer A having a desired refractive index, a method for controlling the refractive index by adding metal oxide particles or metal particles, and a method for controlling the refractive index using a complex of a metal salt and the polymer.

The photosensitive layer is preferably applied to an image display portion of a touch panel, and in that case, the photosensitive layer preferably has high transparency and high transmittance.

[Thickness]

A thickness of the photosensitive layer of the disclosure is preferably 1 μm to 20 μm, more preferably 2 μm to 15 μm, and even more preferably 3 μm to 12 μm.

By setting the film thickness of the photosensitive layer to be in the range described above, the transmittance is hardly reduced.

By setting the film thickness of the photosensitive layer to be in the range described above, the photosensitive layer hardly absorbs a radio wave at a wavelength of 10 nm to 100 nm (short wave) and the photosensitive layer is prevented from being stained into yellow.

<Layer Having High Refractive Index>

The transfer film according to the disclosure preferably further includes a transparent layer having a refractive index at a wavelength of 550 nm higher than that of the photosensitive layer which is 1.50 or more (more preferably, 1.55 or more, particularly preferably 1.60 or more) (layer having a high refractive index) on a side of the photosensitive layer opposite to the temporary support.

In this aspect, in a case of forming a protective film for a touch panel by transferring the photosensitive layer and the layer having a high refractive index of the transfer film to a substrate for a touch panel including a transparent electrode pattern (for example, a transparent electrode pattern consisting of indium tin oxide (ITO)), the transparent electrode pattern is more hardly recognized (that is, concealing properties of the transparent electrode pattern are further improved).

The layer having a high refractive index may be any layer, as long as it has a refractive index at a wavelength of 550 nm higher than that of the photosensitive layer which is 1.50 or more, and there are no other particular limitations.

Regarding the phenomenon that the transparent electrode pattern is recognized, and the concealing properties of the transparent electrode pattern, JP2014-010814A and JP2014-108541A can be suitably referred to.

The "refractive index" in the specification means a value measured with visible light at a wavelength of 550 nm at a temperature of 23° C. by ellipsometry, unless otherwise noted.

The layer having a high refractive index preferably includes at least one kind selected from the group consisting of inorganic particles having a refractive index equal to or greater than 1.50 (more preferably equal to or greater than 1.55, and particularly preferably equal to or greater than 1.60), a polymer compound having a refractive index equal to or greater than 1.50 (more preferably equal to or greater than 1.55, and particularly preferably equal to or greater than 1.60), and a polymerizable monomer having a refractive index equal to or greater than 1.50 (more preferably equal to or greater than 1.55, and particularly preferably equal to or greater than 1.60), from a viewpoint of easily adjusting the refractive index as equal to or greater than 1.50 (more preferably, equal to or greater than 1.55, particularly preferably, equal to or greater than 1.60).

In addition, the layer having a high refractive index preferably includes a binder polymer and particles.

Regarding the components of the layer having a high refractive index, components of a curable transparent resin layer disclosed in paragraphs 0019 to 0040 and 0144 to 0150 of JP2014-108541A, and components of a transparent layer disclosed in paragraphs 0024 to 0035 and 0110 to 0112 of JP2014-010814A, components of a composition including ammonium salt disclosed in paragraphs 0034 to 0056 of WO2016/009980, and components of a composition disclosed in paragraphs 0088 to 0131 of WO2017/155003 can be referred to.

For a specific example of the material of the layer having a high refractive index, a material B-17 of the example of WO2017/155003 can be referred to.

<Protective Film>

The transfer film according to the disclosure may further include a protective film on a side of the photosensitive layer opposite to the temporary support.

In a case where the transfer film according to the disclosure includes the layer having a high refractive index on a side of the photosensitive layer opposite to the temporary support, the protective film is preferably disposed on a side opposite to the temporary support from the view of the layer having a high refractive index.

Examples of the protective film include a polyethylene terephthalate film, a polypropylene film, a polystyrene film, and a polycarbonate film.

As the protective film, a component disclosed in paragraphs 0083 to 0087 and 0093 of JP2006-259138A may be used, for example.

<Thermoplastic Resin Layer>

The transfer film according to the disclosure may further include a thermoplastic resin layer between a temporary support and a photosensitive layer.

In a case where the transfer film includes the thermoplastic resin layer and the transfer film is transferred to a substrate to form a laminate, air bubbles are hardly generated on each component of the laminate. In a case where this laminate is used in an image display device, image unevenness is hardly generated and excellent display properties are obtained.

The thermoplastic resin layer preferably has alkali solubility.

The thermoplastic resin layer functions as a cushion material which absorbs ruggedness of the surface of the substrate in a case of transfer.

The ruggedness of the surface of the substrate includes an image, an electrode, a wiring, and the like which are formed in advance. The thermoplastic resin layer preferably has properties capable of being deformed in accordance with ruggedness.

The thermoplastic resin layer preferably includes an organic polymer substance disclosed in JP1993-072724A (JP-H5-072724A), and more preferably includes an organic polymer substance having a softening point approximately equal to or lower than 80° C. by a Vicat method (specifically, polymer softening point measurement method using an American Society for Testing and Materials ASTM D1235).

A thickness of the thermoplastic resin layer is preferably 3 μm to 30 μm, more preferably 4 μm to 25 μm, and even more preferably 5 μm to 20 μm.

In a case where the thickness of the thermoplastic resin layer is equal to or greater than 3 μm, followability with respect to the ruggedness of the surface of the substrate is improved, and accordingly, the ruggedness of the surface of the substrate can be effectively absorbed.

In a case where the thickness of the thermoplastic resin layer is equal to or smaller than 30 μm, process suitability is further improved. For example, burden of the drying (solvent removal) in a case of applying and forming the thermoplastic resin layer on the temporary support is further reduced, and the development time of the thermoplastic resin layer after the transfer is shortened.

The thermoplastic resin layer can be formed by applying and, as necessary, drying a composition for forming a thermoplastic resin layer including a solvent and a thermoplastic organic polymer on the temporary support.

Specific examples of the applying and drying method are respectively the same as the specific examples of the coating and drying in a case of forming the photosensitive layer.

The solvent is not particularly limited, as long as a polymer component forming the thermoplastic resin layer is dissolved, and examples thereof include organic solvents (for example, methyl ethyl ketone, cyclohexanone, propylene glycol monomethyl ether acetate, n-propanol, and 2-propanol).

A viscosity of the thermoplastic resin layer measured at 100° C. is preferably 1,000 to 10,000 Pa×s. In addition, the viscosity of the thermoplastic resin layer measured at 100° C. is preferably lower than the viscosity of the photosensitive layer measured at 100° C.

<Interlayer>

The transfer film according to the disclosure may further include an interlayer between the temporary support and the photosensitive layer.

In a case where the transfer film according to the disclosure includes the thermoplastic resin layer, the interlayer is preferably disposed between the thermoplastic resin layer and the photosensitive layer.

As the component of the interlayer, a resin which is a mixture including polyvinyl alcohol, polyvinyl pyrrolidone, cellulose, or at least two kinds thereof.

In addition, as the interlayer, a component disclosed in JP1993-072724A (JP-H5-072724A) as a "separation layer" can also be used.

In a case of manufacturing the transfer film of the aspect including the thermoplastic resin layer, the interlayer, and the photosensitive layer on the temporary support in this order, the interlayer can be, for example, formed by applying and, as necessary, drying a composition for forming an interlayer including a solvent which does not dissolve the thermoplastic resin layer, and the resin as the component of the interlayer. Specific examples of the applying and drying method are respectively the same as the specific examples of the coating and drying in a case of forming the photosensitive layer.

In this case, for example, first, the composition for forming a thermoplastic resin layer is applied and dried on the temporary support to form the thermoplastic resin layer. Next, the composition for forming an interlayer is applied and dried on this thermoplastic resin layer to form the interlayer. After that, the photosensitive composition of the aspect including the organic solvent is applied and dried on the interlayer to form the photosensitive layer. The organic solvent in this case is preferably an organic solvent which does not dissolve the interlayer.

Specific Example of Transfer Film

FIG. 1 is a schematic cross sectional view showing a transfer film 10 which is a specific example of the transfer film according to the disclosure.

As shown in FIG. 1, the transfer film 10 has a laminated structure of "protective film 16/layer having a high refractive index 20A/photosensitive layer 18A/temporary support 12" (that is, laminated structure in which a temporary support 12, a photosensitive layer 18A, a layer having a high refractive index 20A, and a protective film 16 are laminated in this order).

However, the transfer film according to the disclosure is not limited to the transfer film 10, and the layer having a high refractive index 20A and the protective film 16 may be omitted, for example. In addition, at least one of the thermoplastic resin layer or the interlayer described above may be included between the temporary support 12 and the photosensitive layer 18A.

The layer having a high refractive index 20A is a layer disposed on a side of the photosensitive layer 18A opposite to the side where the temporary support 12 is present, and a layer having a refractive index at a wavelength of 550 nm equal to or greater than 1.50.

The transfer film 10 is a negative type material (negative type film).

A manufacturing method of the transfer film 10 is not particularly limited.

The manufacturing method of the transfer film 10, for example, includes a step of forming the photosensitive layer 18A on the temporary support 12, a step of forming the layer having a high refractive index 20A on the photosensitive layer 18A, and a step of forming the protective film 16 on the layer having a high refractive index 20A in this order.

The manufacturing method of the transfer film 10 may include a step of volatilizing ammonia disclosed in a paragraph 0056 of WO2016/009980, between the step of forming the layer having a high refractive index 20A and the step of forming the protective film 16.

(Electrode Protective Film, Laminate, and Capacitive Input Device)

The electrode protective film according to the disclosure is an electrode protective film in which the temporary support is removed from the transfer film according to the disclosure.

The electrode protective film according to the disclosure is preferably an electrode protective film of the capacitive input device and more preferably an electrode protective film for a touch panel.

The laminate according to the disclosure described below includes the electrode protective film according to the disclosure.

The laminate according to the disclosure includes a photosensitive layer after removing a temporary support from the transfer film according to the disclosure, on a substrate including an electrode of a capacitive input device.

In addition, the laminate according to the disclosure preferably includes a layer having a high refractive index and a photosensitive layer after removing a temporary support from the transfer film according to the disclosure, on a substrate including an electrode of a capacitive input device, in order from the substrate side.

The capacitive input device according to the disclosure includes the electrode protective film according to the disclosure or the laminate according to the disclosure.

The electrode of the capacitive input device may be a transparent electrode pattern or a leading wiring. In the laminate, the electrode of the capacitive input device is preferably an electrode pattern and more preferably a transparent electrode pattern.

It is preferable that the laminate according to the disclosure includes a substrate, a transparent electrode pattern, a layer having a high refractive index disposed to be adjacent to the transparent electrode pattern, and a photosensitive layer disposed to be adjacent to the layer having a high refractive index, and a refractive index of the layer having a high refractive index is higher than a refractive index of the photosensitive layer. The refractive index of the layer having a high refractive index is preferably equal to or greater than 1.6.

By using the configuration of the laminate described above, concealing properties of the transparent electrode pattern are improved.

As the substrate, a glass substrate or a resin substrate is preferable.

In addition, the substrate is preferably a transparent substrate and more preferably a transparent resin substrate. The meaning of the transparency is as described above.

A refractive index of the substrate is preferably 1.50 to 1.52.

As the glass substrate, tempered glass such as GORILLA GLASS (registered trademark) manufactured by Corning Incorporated can be used.

As the resin substrate, at least one of a component with slight optical strains or a component having high transparency is preferably used, and a substrate consisting of a resin such as polyethylene terephthalate (PET), polyethylene naphthalate (PEN), polycarbonate (PC), triacetyl cellulose (TAC), polyimide (PI), polybenzoxazole (PBO), or cycloolefin polymer (COP) is used, for example.

As a material of the transparent substrate, a material disclosed in JP2010-086684A, JP2010-152809A, and JP2010-257492A is preferably used.

As the capacitive input device, a touch panel is suitably used.

As the electrode for a touch panel, a transparent electrode pattern disposed at least in an image display region of the touch panel is used. The electrode for a touch panel may extend from the image display region to a frame portion of the touch panel.

As the wiring for a touch panel, the leading wiring (lead-out wiring) disposed on the frame portion of the touch panel is used, for example.

As a preferred aspect of the substrate for a touch panel and the touch panel, an aspect in which the transparent electrode pattern and the leading wiring are electrically connected to each other by laminating a part of the leading wiring on a portion of the transparent electrode pattern extending to the frame portion of the touch panel, is suitable.

As a material of the transparent electrode pattern, a metal oxide film of indium tin oxide (ITO) and indium zinc oxide (IZO) is preferable.

As a material of the leading wiring, metal is preferable. Examples of the metal which is the material of the leading wiring include gold, silver, copper, molybdenum, aluminum, titanium, chromium, zinc, and manganese, and alloy consisting of two or more kinds of these metal elements. As the material of the leading wiring, copper, molybdenum, aluminum, or titanium is preferable, copper is particularly preferable.

The electrode protective film for a touch panel according to the disclosure is provided so as to cover the electrode and the like directly or through other layers, in order to protect the electrode and the like (that is, at least one of the electrode for a touch panel and the wiring for a touch panel).

The preferred range of a thickness of the electrode protective film for a touch panel is the same as the preferred range of a thickness of the photosensitive layer described above.

The electrode protective film according to the disclosure, preferably the electrode protective film for a touch panel may include an opening.

The opening can be formed by dissolving an unexposed portion of the photosensitive layer with a developer.

In this case, in a case where the electrode protective film for a touch panel is formed under the laminating condition at a high temperature using the transfer film, the development residue of the opening of the electrode protective film for a touch panel is prevented.

The touch panel may further include a first refractive index adjusting layer between the electrode and the like and the electrode protective film for a touch panel (for example, see first specific example of the touch panel which will be described later).

The preferred aspect of the first refractive index adjusting layer is the same as the preferred aspect of the layer having a high refractive index included in the transfer film. The first refractive index adjusting layer may be formed by applying and drying a composition for forming the first refractive index adjusting layer, or may be formed by transferring the refractive index adjusting layer of the transfer film including the refractive index adjusting layer.

The touch panel of the aspect including the first refractive index adjusting layer is preferably formed by transferring the photosensitive layer and the layer having a high refractive index of the transfer film by using the transfer film according to the disclosure of the aspect including the layer having a high refractive index. In this case, the electrode protective film for a touch panel is formed of the photosensitive layer of the transfer film, and the first refractive index adjusting layer is formed of the layer having a high refractive index of the transfer film.

In addition, the touch panel or the substrate for a touch panel may include a second refractive index adjusting layer between the substrate and the electrode and the like (for example, see, first specific example of the touch panel which will be described later).

The preferred aspect of the second refractive index adjusting layer is the same as the preferred aspect of the layer having a high refractive index included in the transfer film.

The aspect in which the touch panel includes the first refractive index adjusting layer (more preferably, aspect of including the first refractive index adjusting layer and the second refractive index adjusting layer) has an advantage in which the electrode and the like are hardly recognized (that is, so-called see-through is prevented).

Regarding the structure of the touch panel, a structure of a capacitive input device disclosed in JP2014-010814A or JP2014-108541A may be referred to.

First Specific Example of Touch Panel

Figure 2:
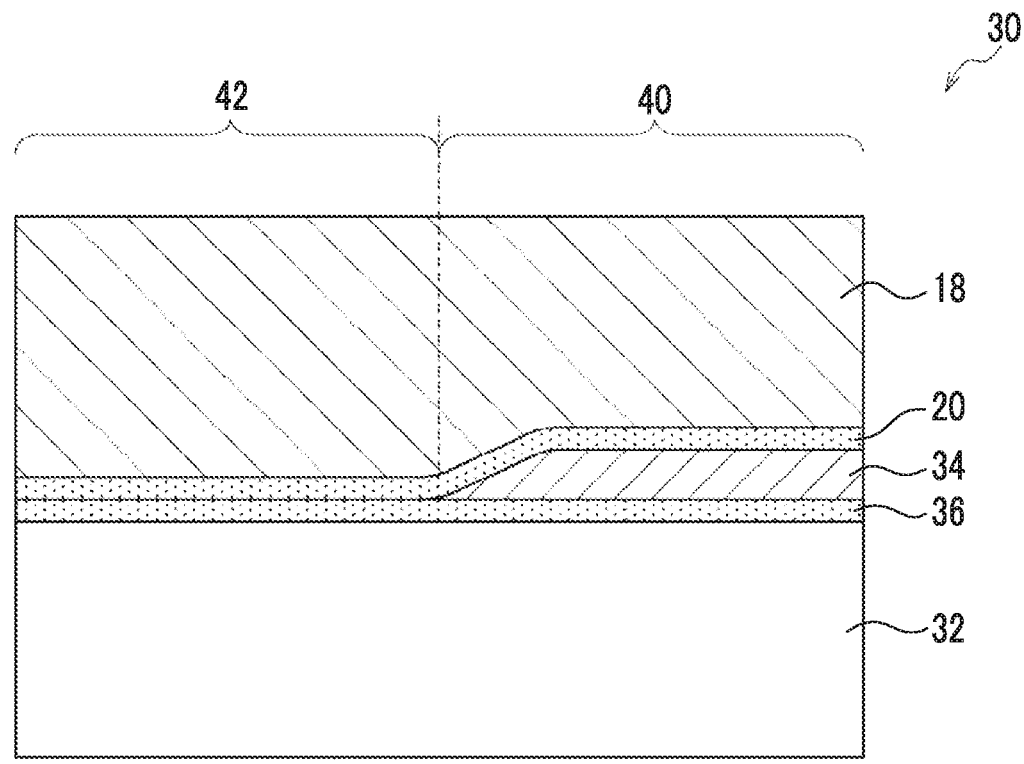
FIG. 2 is a schematic cross sectional view showing a first specific example of a touch panel according to an embodiment of the invention.

FIG. 2 is a schematic cross sectional view of a touch panel 30 which is the first specific example of the touch panel according to the disclosure. More specifically, FIG. 2 is a schematic cross sectional view of an image display region of the touch panel 30.

As shown in FIG. 2, the touch panel 30 has a structure in which a substrate 32, a second refractive index adjusting layer 36, a transparent electrode pattern 34 as the electrode for a touch panel, a first refractive index adjusting layer 20, and an electrode protective film 18 for a touch panel are disposed in this order.

In the touch panel 30, the electrode protective film 18 for a touch panel and the first refractive index adjusting layer 20 cover the entire transparent electrode pattern 34. However, the touch panel according to the disclosure is not limited to this aspect. The electrode protective film 18 for a touch panel and the first refractive index adjusting layer 20 may cover at least a portion of the transparent electrode pattern 34.

In addition, the second refractive index adjusting layer 36 and the first refractive index adjusting layer 20 are preferably respectively continuously coated over a first region 40 in which the transparent electrode pattern 34 is present and a second region 42 in which the transparent electrode pattern 34 is not present directly or through another layer. Accordingly, the transparent electrode pattern 34 is more hardly recognized.

The second refractive index adjusting layer 36 and the first refractive index adjusting layer 20 are preferably coated directly over both of the first region 40 and the second region 42, rather than the coating through the other layer. Examples of the "other layer" include an insulating layer and an electrode pattern other than the transparent electrode pattern 34.

The first refractive index adjusting layer 20 is laminated over both of the first region 40 and the second region 42. The first refractive index adjusting layer 20 is adjacent to the second refractive index adjusting layer 36 and is also adjacent to the transparent electrode pattern 34.

In a case where the shape of the end portion of the transparent electrode pattern 34 at a portion in contact with the second refractive index adjusting layer 36 is a tapered shape as shown in FIG. 2, the first refractive index adjusting layer 20 is preferably laminated along the tapered shape (that is, at the same tilt as the taper angle).

As the transparent electrode pattern 34, the ITO transparent electrode pattern is suitable.

The transparent electrode pattern 34 can be, for example, formed by the following method.

A thin film for an electrode (for example, ITO film) is formed on the substrate 32 on which the second refractive index adjusting layer 36 is formed by sputtering. By applying a photosensitive resist for etching or transferring a photosensitive film for etching onto the thin film for an electrode, an etching protective layer is formed. Then, this etching protective layer is patterned in a desired pattern shape by exposure and development. Next, a portion of the thin film for an electrode which is not covered with the patterned etching protective layer is removed by etching. Accordingly, the thin film for an electrode is set to have a pattern having a desired shape (that is, transparent electrode pattern 34). Then, the patterned etching protective layer is removed by a peeling solution.

The first refractive index adjusting layer 20 and the electrode protective film 18 for a touch panel are, for example, formed on the substrate 32 (that is, substrate for a touch panel) on which the second refractive index adjusting layer 36 and the transparent electrode pattern 34 are provided in order, as described below.

First, the transfer film 10 (that is, transfer film 10 having a laminated structure of "protective film 16/layer having a high refractive index 20A/photosensitive layer 18A/temporary support 12") shown in FIG. 1 is prepared.

Next, the protective film 16 is removed from the transfer film 10.

Then, the transfer film 10, from which the protective film 16 is removed, is laminated on the substrate 32 (that is, substrate for a touch panel) on which the second refractive index adjusting layer 36 and the transparent electrode pattern 34 are provided in order. The laminating is performed in a direction in which the layer having a high refractive index 20A of the transfer film 10, from which the protective film 16 is removed, and the transparent electrode pattern 34 are in contact with each other. By this laminating, a laminate having a laminated structure of "temporary support 12/photosensitive layer 18A/layer having a high refractive index 20A/transparent electrode pattern 34/second refractive index adjusting layer 36/substrate 32" is obtained.

Next, the temporary support 12 is removed from the laminate.

Then, by performing the pattern exposure with respect to the laminate, from which the temporary support 12 is removed, the photosensitive layer 18A and the layer having a high refractive index 20A are cured in a pattern shape. The hardening of the photosensitive layer 18A and the layer having a high refractive index 20A in a pattern shape may be respectively individually performed by individual pattern exposure, but the hardening is preferably performed at the same time by the pattern exposure at one time.

Next, by removing the unexposed portion (that is, uncured portion) of the photosensitive layer 18A and the layer having a high refractive index 20A by the development, the electrode protective film 18 for a touch panel which is a patterned cured product of the photosensitive layer 18A (not shown regarding the pattern shape), and the first refractive index adjusting layer 20 which is a patterned cured product of the layer having a high refractive index 20A (not shown regarding the pattern shape) are respectively obtained. The development of the photosensitive layer 18A and the layer having a high refractive index 20A after the pattern exposure may be respectively individually performed by individual development, but the development is preferably performed at the same time by the development at one time.

The preferred aspects of the laminating, the pattern exposure, and the development will be described later.

Regarding the structure of the touch panel, a structure of a capacitive input device disclosed in JP2014-010814A or JP2014-108541A may be referred to.

Second Specific Example of Touch Panel

Figure 3:
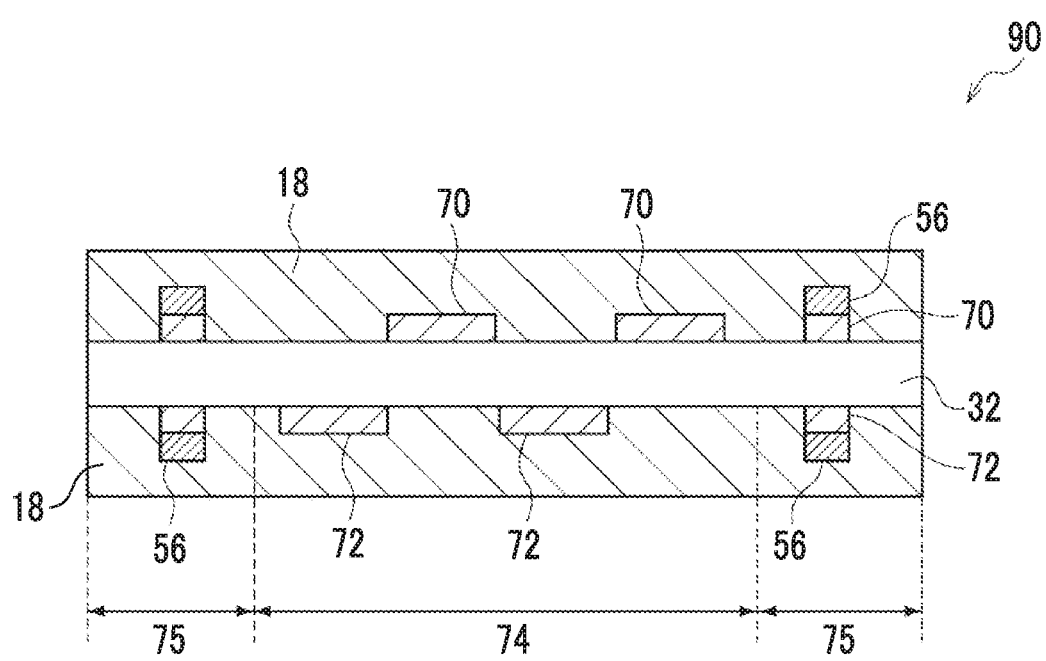
FIG. 3 is a schematic cross sectional view showing a second specific example of the touch panel according to an embodiment of the invention.

FIG. 3 is a schematic cross sectional view of a touch panel 90 which is a second specific example of the touch panel according to the disclosure.

As shown in FIG. 3, the touch panel 90 includes an image display region 74 and an image non-display region 75 (that is, frame portion).

As shown in FIG. 3, the touch panel 90 includes the electrode for a touch panel on both surfaces of the substrate 32. Specifically, the touch panel 90 includes a first transparent electrode pattern 70 on one surface of the substrate 32 and includes a second transparent electrode pattern 72 on the other surface thereof.

In the touch panel 90, a leading wiring 56 is connected to the first transparent electrode pattern 70 and the second transparent electrode pattern 72, respectively. The leading wiring 56 is, for example, a copper wiring.

In the touch panel 90, the electrode protective film 18 for a touch panel is formed on one surface of the substrate 32 so as to cover the first transparent electrode pattern 70 and the leading wiring 56, and the electrode protective film 18 for a touch panel is formed on the other surface of the substrate 32 so as to cover the second transparent electrode pattern 72 and the leading wiring 56.

The first refractive index adjusting layer and the second refractive index adjusting layer of the first specific example may be provided on the one surface and the other surface of the substrate 32, respectively.

<Manufacturing Method of Touch Panel>

The method of manufacturing the touch panel according to the disclosure is not particularly limited, and the following manufacturing method is preferable.

The preferred manufacturing method of the touch panel according to the disclosure includes a step for convenience, and is a step of preparing a substrate for a touch panel having a structure in which the electrode and the like (that is, at least one of the electrode for a touch panel and the wiring for a touch panel) are disposed on a substrate (hereinafter, also referred to as a "preparation step"), a step of forming a photosensitive layer on a surface of the substrate for a touch panel, on a side where the electrode and the like are disposed, using the transfer film according to the disclosure (hereinafter, also referred to as a "photosensitive layer forming step"), a step of performing the pattern exposure with respect to the photosensitive layer formed on the surface of the substrate for a touch panel (hereinafter, also referred to as a "pattern exposure step"), and a step of developing the pattern-exposed photosensitive layer to obtain an electrode protective film for a touch panel which protects at least a part of the electrode or the like (hereinafter, also referred to as a "development step").

According to the preferred manufacturing method, a touch panel including the electrode protective film for a touch panel having a decreased WVTR can be manufactured.

In addition, in the preferred manufacturing method, even in a case where the photosensitive layer is formed under the laminating condition at a high temperature using the transfer film according to the disclosure, the occurrence of the development residue is prevented in the unexposed portion of the photosensitive layer after the development.

Hereinafter, each step of the preferred manufacturing method will be described.

<Preparation Step>

The preparation step is a step for convenience, and is a step of preparing a substrate for a touch panel having a structure in which the electrode and the like (that is, at least one of the electrode for a touch panel and the wiring for a touch panel) are disposed on a substrate.

The preparation step may be a step of only simply preparing the substrate for a touch panel manufactured in advance, or may be a step of manufacturing the substrate for a touch panel.

The preferred aspect of the substrate for a touch panel is as described above.

<Photosensitive Layer Forming Step>

The photosensitive layer forming step is a step of forming a photosensitive layer on a surface of the substrate for a touch panel, on a side where the electrode and the like are disposed, using the transfer film according to the disclosure.

Hereinafter, in the photosensitive layer forming step, the aspect using the transfer film according to the disclosure will be described.

In this aspect, the photosensitive layer is formed on the surface by laminating the transfer film according to the disclosure on the surface of the substrate for a touch panel on a side on which the electrode and the like are disposed, and transferring the photosensitive layer of the transfer film according to the disclosure on the surface.

The laminating (transfer of the photosensitive layer) can be performed using a well-known laminator such as a vacuum laminator or an auto-cut laminator.

As the laminating condition, a general condition can be applied.

A laminating temperature is preferably 80° C. to 150° C. and more preferably 90° C. to 150° C.

As described above, in the aspect using the transfer film according to the disclosure, even in a case where the laminating temperature is a high temperature (for example, 120° C. to 150° C.), the occurrence of the development residue due to thermal fogging is prevented.

In a case of using a laminator including a rubber roller, the laminating temperature indicates a temperature of the rubber roller.

A temperature of the substrate in a case of laminating is not particularly limited. The temperature of the substrate in a case of laminating is 10° C. to 150° C., preferably 20° C. to 150° C., and more preferably 30° C. to 150° C. In a case of using a resin substrate as the substrate, the temperature of the substrate in a case of laminating is preferably 10° C. to 80° C., more preferably 20° C. to 60° C., and particularly preferably 30° C. to 50° C.

In addition, linear pressure in a case of laminating is preferably 0.5 N/cm to 20 N/cm, more preferably 1 N/cm to 10 N/cm, and particularly preferably 1 N/cm to 5 N/cm.

In addition, a transportation speed (laminating speed) in a case of laminating is preferably 0.5 m/min to 5 m/min and more preferably 1.5 m/min to 3 m/min.

In a case of using the transfer film having a laminated structure of "the protective film/photosensitive layer/interlayer/thermoplastic resin layer/temporary support", first, the protective film is peeled off from the transfer film to expose the photosensitive layer, the transfer film and the substrate for a touch panel are bonded to each other so that the exposed photosensitive layer and the surface of the substrate for a touch panel on a side on which the electrode and the like are disposed are in contact with each other, and heating and pressurizing are performed. Accordingly, the photosensitive layer of the transfer film is transferred onto the surface of the substrate for a touch panel on a side on which the electrode and the like are disposed, and a laminate having a laminated structure of "temporary support/thermoplastic resin layer/interlayer/photosensitive layer/electrode and the like/substrate" is formed. In this laminated structure, the portion of "electrode and the like/substrate" is the substrate for a touch panel.

After that, the temporary support is peeled off from the laminate, as necessary. However, the pattern exposure which will be described later can be also performed, by leaving the temporary support.

As an example of the method of transferring the photosensitive layer of the transfer film on the substrate for a touch panel and performing pattern exposure and development, a description disclosed in paragraphs 0035 to 0051 of JP2006-023696A can also be referred to.

<Pattern Exposure Step>

The pattern exposure step is a step of performing the pattern exposure with respect to the photosensitive layer formed on the substrate for a touch panel.

Here, the pattern exposure indicates exposure of the aspect of performing the exposure in a pattern shape, that is, the aspect in which an exposed portion and an unexposed portion are present.

The exposed portion of the photosensitive layer on the substrate for a touch panel in the pattern exposure is cured and finally becomes the cured film.

Meanwhile, the unexposed portion of the photosensitive layer on the substrate for a touch panel in the pattern exposure is not cured, and is removed (dissolved) with a developer in the subsequent development step. With the unexposed portion, the opening of the cured film can be formed after the development step.

The pattern exposure may be exposed through a mask or may be digital exposure using a laser or the like.

As a light source of the pattern exposure, a light source can be suitably selected, as long as it can emit light at a wavelength region (for example, 365 nm or 405 nm) at which the photosensitive layer can be cured. Examples of the light source include various lasers, a light emitting diode (LED), an ultra-high pressure mercury lamp, a high pressure mercury lamp, and a metal halide lamp. An exposure intensity is preferably 5 mJ/cm$^2$ to 200 mJ/cm$^2$, and more preferably 10 mJ/cm$^2$ to 200 mJ/cm$^2$.

In a case where the photosensitive layer is formed on the substrate using the transfer film, the pattern exposure may be performed after peeling the temporary support, or the temporary support may be peeled off after performing the exposure before peeling off the temporary support.

In addition, in the exposure step, the heat treatment (so-called post exposure bake (PEB)) may be performed with respect to the photosensitive layer after the pattern exposure and before the development.

<Development Step>

The development step is a step of obtaining the electrode protective film for a touch panel which protects at least a portion of the electrode and the like, by developing the pattern-exposed photosensitive layer (that is, by dissolving the unexposed portion of the pattern exposure with a developer).

A developer used in the development is not particularly limited, and a well-known developer such as a developer disclosed in JP1993-072724A (JP-H5-072724A) can be used.

As the developer, an alkali aqueous solution is preferably used.

Examples of the alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

The pH of the alkali aqueous solution at 25° C. is preferably 8 to 13, more preferably 9 to 12, and particularly preferably 10 to 12.

A content of the alkali compound in the alkali aqueous solution is preferably 0.1% by mass to 5% by mass and more preferably 0.1% by mass to 3% by mass with respect to a total amount of the alkali aqueous solution.

The developer may include an organic solvent having miscibility with water.

Examples of the organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, e-caprolactone, g-butyrolactone, dimethylformamide, dimethylacetamide, hexamethylphosphoramide, ethyl lactate, methyl lactate, e-caprolactam, and N-methylpyrrolidone.

A concentration of the organic solvent is preferably 0.1% by mass to 30% by mass.

The developer may include a well-known surfactant. A concentration of the surfactant is preferably 0.01% by mass to 10% by mass.

A liquid temperature of the developer is preferably 20° C. to 40° C.

Examples of the development method include methods such as puddle development, shower development, shower and spin development, and dip development.

In a case of the shower development, the unexposed portion of the photosensitive layer is removed by spraying the developer to the photosensitive layer after the pattern exposure as a shower. In a case of using the transfer film including at least one of the photosensitive layer, the thermoplastic resin layer, and the interlayer, after the transfer of these layers onto the substrate and before the development of the photosensitive layer, an alkali solution having a low solubility of the photosensitive layer may be sprayed as a shower, and at least one of the thermoplastic resin layer or the interlayer (both layers, in a case where both layers are present) may be removed in advance.

In addition, after the development, the development residue is preferably removed by spraying a cleaning agent with a shower and rubbing with a brush or the like.

A liquid temperature of the developer is preferably 20° C. to 40° C.

The development step may include a stage of performing the development, and a stage of performing the heat treatment (hereinafter, also referred to as "post baking") with respect to the cured film obtained by the development.

In a case where the substrate is a resin substrate, a temperature of the post baking is preferably 100° C. to 180° C. and more preferably 130° C. to 180° C.

A resistance value of the transparent electrode pattern can also be adjusted by this post baking.

In addition, in a case where the photosensitive layer includes a carboxyl group-containing (meth)acrylic resin, at least a part of the carboxyl group-containing (meth)acrylic resin can be changed to carboxylic acid anhydride by the post baking.

In particular, in a case where the photosensitive layer includes the thermal crosslinking compound, crosslinkage in the cured film become dense by performing the post baking and the WVTR is more likely to be decreased.

In addition, the development step may include a stage of performing the development, and a stage of exposing the cured film obtained by the development (hereinafter, also referred to as "post exposure").

In a case where the development step includes a stage of performing the post exposure and a stage of performing the post baking, the post exposure and the post baking are preferably performed in this order.

Regarding the pattern exposure and the development, a description disclosed in paragraphs 0035 to 0051 of JP2006-023696A can be referred to, for example.

The preferred manufacturing method of the touch panel of the disclosure may include a step other than the steps described above. As the other step, a step (for example, washing step or the like) which may be provided in a normal photolithography step can be applied without any particular limitations.

(Image Display Device)

The device according to the disclosure includes the capacitive input device according to the disclosure, preferably, the touch panel according to the disclosure (for example, touch panels of the first and second specific examples).

As the image display device according to the disclosure, a liquid crystal display apparatus having a structure in which the touch panel according to the disclosure is overlapped on a well-known liquid crystal display element is preferable.

As the structure of the image display device including the touch panel, for example, a structure disclosed in "The latest Touch Panel Technology" (published 6 Jul. 2009, Techno Times), "Technologies and Developments of Touch Panels" supervised by Yuji Mitani, CMC Publishing CO., LTD. (2004, 12), FPD International 2009 Forum T-11 lecture text book, Cypress Semiconductor Corporation application note AN 2292 can be applied.

EXAMPLES

Hereinafter, the disclosure will be described more specifically with reference to examples. The material, the amount used, the ratio, the process contents, the process procedure, and the like shown in the following examples can be suitably changed, within a range not departing from a gist of the disclosure. Accordingly, the range of the disclosure is not limited to specific examples shown below. "part" and "%" are based on mass, unless otherwise noted.

In the following examples, a weight-average molecular weight of a resin is a weight-average molecular weight obtained by performing polystyrene conversion of a value measured by gel permeation chromatography (GPC). In addition, as the acid value, a theoretical acid value.

Synthesis of Resin A

First, as resins included in the photosensitive layer of the transfer film, polymers P-1 to P-17 which are specific examples of the polymer A used in the disclosure and a polymers R-1 to R-4 which are polymers for comparative examples were respectively synthesized.

Synthesis of Polymer P-1

244.2 parts by mass of propylene glycol monomethyl ether (MFG, manufactured by Wako Pure Chemical Industries, Ltd.) was put into a three-neck flask and held at 90° C. under nitrogen. A mixed solution of 120.4 parts by mass of dicyclopentanyl methacrylate (manufactured by Tokyo Chemical Industry Co., Ltd.), 96.1 parts by mass of methacrylic acid (MAA, manufactured by Wako Pure Chemical Industries, Ltd.), 87.2 parts by mass of styrene (manufactured by Wako Pure Chemical Industries, Ltd.), 188.5 parts by mass of MFG, 0.0610 parts by mass of p-methoxyphenol (manufactured by Wako Pure Chemical Industries, Ltd.), and 16.7 parts by mass of V-601 (dimethyl 2,2'-azobis (2-methyl propionate, manufactured by Wako Pure Chemical Industries, Ltd.) was added thereto dropwise over 3 hours.

After the dropwise addition, the mixture was stirred at 90° C. for 1 hour, a mixed solution of V-601 (2.1 parts by mass) and MFG (5.2 parts by mass) was added and stirred for 1 hour, and a mixed solution of V-601 (2.1 parts by mass) and MFG (5.2 parts by mass) was further added thereto. After stirring for 1 hour, a mixed solution of V-601 (2.1 parts by mass) and MFG (5.2 parts by mass) was further added thereto. After stirring for 3 hours, 2.9 parts by mass of MFG and 166.9 parts by mass of propylene glycol monomethyl ether acetate (PGMEA, manufactured by Daicel Chemical) were added thereto and stirred until it became uniform.

1.5 parts by mass of tetramethylammonium bromide (TEAB, manufactured by Tokyo Chemical Industry Co., Ltd.) and 0.7 parts by mass of p-methoxyphenol were added to the reaction solution as the additive catalyst, and a temperature was increased to 100° C. In addition, 62.8 parts by mass of glycidyl methacrylate (GMA, manufactured by Wako Pure Chemical Industries, Ltd.) was added stirred at 100° C. for 9 hours to obtain a MFG/PGMEA mixed solution of the polymer P-1. The weight-average molecular weight of P-1 measured by GPC was 20,000 (polystyrene conversion) and the concentration of solid contents was 36.3% by mass.

Synthesis of Polymers P-2 to P-17 and R-1 to R-4

Polymers P-2 to P-17 and R-1 to R-4 were synthesized in the same manner as in the synthesis of the polymer P-1, except that each constitutional unit contained in the polymer and the content of each constitutional unit were changed as shown in Table 1. Each polymer was synthesized as a polymer solution, and the amount of the diluent (PGMEA) was adjusted so that a polymer concentration (concentration of solid contents) in the polymer solution was 35% by mass.

Here, the polymers R-1 to R-4 are comparative polymers.

In Table 1, constitutional units other than the constitutional unit having the radically polymerizable group are shown with abbreviations of monomers for forming each constitutional unit.

The constitutional units having the radically polymerizable group are shown in a form of an additional structure of a monomer and a monomer. For example, MAA-GMA means a constitutional unit obtained by adding glycidyl methacrylate to a constitutional unit derived from methacrylic acid.

TABLE 1

| Polymer | | P-1 | P-2 | P-3 | P-4 | P-5 | P-6 | P-7 | P-8 | P-9 | P-10 | P-11 |
|---|---|---|---|---|---|---|---|---|---|---|---|---|
| Constitutional unit A1 (% by mass) | St | 24 | 16 | 10 | — | — | 24 | 24 | 24 | 24 | 24 | 24 |
| | VN | — | — | — | 24 | — | — | — | — | — | — | — |
| | AMS | — | — | — | — | 24 | — | — | — | — | — | — |
| Constitutional unit B1 (% by mass) | DCPMA | 33 | 41 | 47 | 33 | 33 | 26 | 22 | 15 | — | — | — |
| | IBXMA | — | — | — | — | — | — | — | — | 33 | — | — |
| | PMI | — | — | — | — | — | — | — | — | — | 33 | — |
| | ADMA | — | — | — | — | — | — | — | — | — | — | 33 |
| | ADA | — | — | — | — | — | — | — | — | — | — | — |
| | DCPA | — | — | — | — | — | — | — | — | — | — | — |
| | CHMA | — | — | — | — | — | — | — | — | — | — | — |
| Constitutional unit C1 (% by mass) | MAA-GMA | 27 | 27 | 27 | 27 | 27 | 34 | 38 | 45 | 27 | 27 | 27 |
| | MAA-M100 | — | — | — | — | — | — | — | — | — | — | — |
| Constitutional unit D1 (% by mass) | MAA | 16 | 16 | 16 | 16 | 16 | 16 | 16 | 16 | 16 | 16 | 16 |
| | AA | — | — | — | — | — | — | — | — | — | — | — |
| Other constitutional unit (% by mass) | MMA | — | — | — | — | — | — | — | — | — | — | — |
| | nBMA | — | — | — | — | — | — | — | — | — | — | — |
| Total | | 100 | 100 | 100 | 100 | 100 | 100 | 100 | 100 | 100 | 100 | 100 |

| Polymer | | P-12 | P-13 | P-14 | P-15 | P-16 | P-17 | R-1 | R-2 | R-3 | R-4 |
|---|---|---|---|---|---|---|---|---|---|---|---|
| Constitutional unit A1 (% by mass) | St | 24 | 24 | 24 | 24 | 24 | 24 | 5 | 34 | 24 | 48 |
| | VN | — | — | — | — | — | — | — | — | — | — |
| | AMS | — | — | — | — | — | — | — | — | — | — |
| Constitutional unit B1 (% by mass) | DCPMA | — | — | 33 | 33 | 27 | 27 | — | 12 | — | 35 |
| | IBXMA | — | — | — | — | — | — | — | — | — | — |
| | PMI | — | — | — | — | — | — | — | — | — | — |
| | ADMA | — | — | — | — | — | — | 36 | — | — | — |
| | ADA | 33 | — | — | — | — | — | — | — | — | — |
| | DCPA | — | 33 | — | — | — | — | — | — | — | — |
| | CHMA | — | — | — | — | — | — | — | — | 33 | — |
| Constitutional unit C1 (% by mass) | MAA-GMA | 27 | 27 | — | 27 | 27 | 27 | 48 | 44 | 27 | — |
| | MAA-M100 | — | — | 27 | — | — | — | — | — | — | — |
| Constitutional unit D1 (% by mass) | MAA | 16 | 16 | 16 | — | — | — | 11 | 10 | 16 | 17 |
| | AA | — | — | — | 16 | 16 | 16 | — | — | — | — |
| Other constitutional unit (% by mass) | MMA | — | — | — | — | 6 | — | — | — | — | — |
| | nBMA | — | — | — | — | — | 6 | — | — | — | — |
| Total | | 100 | 100 | 100 | 100 | 100 | 100 | 100 | 100 | 100 | 100 |

[Explanation of Table 1]

The meanings of the abbreviations are as follows.

St: Styrene (manufactured by Wako Pure Chemical Industries, Ltd.)

VN: Vinyl naphthalene (manufactured by Wako Pure Chemical Industries, Ltd.)

AMS: α-methylstyrene (manufactured by Tokyo Chemical Industry Co., Ltd.)

DCPMA: dicyclopentanyl methacrylate (Tg: 175° C., fancryl FA-513M, manufactured by Hitachi Chemical Co., Ltd.)

IBXMA: isobornyl methacrylate (Tg: 173° C., light ester IB-X, manufactured by Kyoeisha Chemical Co., Ltd.)

PMI: N-phenylmaleimide (Tg: 276° C., Imilex-P, manufactured by Nippon Shokubai Co., Ltd.)

ADMA: 1-adamantyl methacrylate (Tg: 250° C., Adamantate AM (manufactured by Idemitsu Kosan Co., Ltd.))

ADA: 1-adamantyl acrylate (Tg: 153° C., Adamantate AA (manufactured by Idemitsu Kosan Co., Ltd.))

DCPA: dicyclopentanyl acrylate (Tg: 120° C., fancryl FA-513AS, manufactured by Hitachi Chemical Co., Ltd.)

CHMA: cyclohexyl methacrylate (Tg=66° C., CHMA, manufactured by Mitsubishi Gas Chemical Co., Ltd.)

MAA-GMA: constitutional unit obtained by adding glycidyl methacrylate to a constitutional unit derived from methacrylic acid MAA-M100: a constitutional unit obtained by adding CYM-M100 (manufactured by Daicel Corporation; 3,4-epoxycyclohexylmethyl methacrylate) to a constitutional unit derived from methacrylic acid MAA: methacrylic acid (manufactured by Wako Pure Chemical Industries, Ltd.)

AA: Acrylic acid (manufactured by Wako Pure Chemical Industries, Ltd.)

MMA: methyl methacrylate (manufactured by Wako Pure Chemical Industries, Ltd.)

nBMA: normal butyl methacrylate (manufactured by Wako Pure Chemical Industries, Ltd.)

<Preparation of Photosensitive Composition>

In each example or comparative example, a photosensitive composition having a composition shown in Table 2 or Table 3 below was prepared. In Table 2 or Table 3, a numerical value of each component represents a content (parts by mass) of each component, and an amount of the polymer means an amount of the polymer solution (polymer concentration: 36.3% by mass).

TABLE 2

|  |  | Examples | | | | | |
|---|---|---|---|---|---|---|---|
|  |  | 1 | 2 | 3 | 4 | 5 | 6 |
| Radically polymerizable compound | Tricyclodecane dimethanol diacrylate (A-DCP manufactured by Shin-Nakamura Chemical Co., Ltd.) | 5.53 | 5.53 | 5.53 | 5.53 | 5.53 | 5.53 |
|  | Urethane acrylate 8UX-015A (manufactured by Taisei Fine Chemical Co., Ltd.) | 2.76 | 2.76 | 2.76 | 2.76 | 2.76 | 2.76 |
|  | Urethane acrylate EBECRYL 8465 (manufactured by Daicel-Allnex Ltd.) | — | — | — | — | — | — |
|  | Epoxy acrylate EBECRYL 3703 (manufactured by Daicel-Allnex Ltd.) | — | — | — | — | — | — |
|  | Carboxy acid-containing monomer ARONIX TO-2349 (manufactured by Toagosei Co., Ltd.) | 0.92 | 0.92 | 0.92 | 0.92 | 0.92 | 0.92 |
|  | Ditrimethylolpropane tetraacrylate (AD-TMP manufactured by Shin-Nakamura Chemical Co., Ltd.) | — | — | — | — | — | — |
| Polymer A | P-1 | 42.31 | — | — | — | — | — |
|  | P-2 | — | 42.31 | — | — | — | — |
|  | P-3 | — | — | 42.31 | — | — | — |
|  | P-4 | — | — | — | 42.31 | — | — |
|  | P-5 | — | — | — | — | 42.31 | — |
|  | P-6 | — | — | — | — | — | 42.31 |
|  | P-7 | — | — | — | — | — | — |
|  | P-8 | — | — | — | — | — | — |
|  | P-9 | — | — | — | — | — | — |
|  | P-10 | — | — | — | — | — | — |
|  | P-11 | — | — | — | — | — | — |
|  | P-12 | — | — | — | — | — | — |
|  | P-13 | — | — | — | — | — | — |
|  | P-14 | — | — | — | — | — | — |
|  | P-15 | — | — | — | — | — | — |
|  | P-16 | — | — | — | — | — | — |
|  | P-17 | — | — | — | — | — | — |
|  | R-1 | — | — | — | — | — | — |
|  | R-2 | — | — | — | — | — | — |
|  | R-3 | — | — | — | — | — | — |
|  | R-4 | — | — | — | — | — | — |
| Photopolymerization initiator | Ethanone, 1-[9-ethyl-6-(2-methylbenzoyl)-9H-carbazol-3-yl]-, 1-(O-acetyloxime) (OXE-02, manufactured by BASF Japan Ltd.) | 0.11 | 0.11 | 0.11 | 0.11 | 0.11 | 0.11 |
|  | 2-methyl-1-(4-methylthiophenyl)-2-morpholinopropan-1-one (IRGACURE 907, manufactured by BASF Japan Ltd.) | 0.21 | 0.21 | 0.21 | 0.21 | 0.21 | 0.21 |
|  | 1,2-octanedione, 1-[4-(phenylthio)-, 2-(O-benzoyloxime)] (OXE-01, manufactured by BASF Japan Ltd.) | — | — | — | — | — | — |
| Thermal crosslinking compound | KARENZ AOI-BM (manufactured by Showa Denko KK, photopolymerizable blocked isocyanate) | 3.63 | 3.63 | 3.63 | 3.63 | 3.63 | 3.63 |
|  | KARENZ MOI-BM (manufactured by Showa Denko KK, photopolymerizable blocked isocyanate) | — | — | — | — | — | — |
|  | MA-DGIC (manufactured by Shikoku Chemicals Co., Ltd., photopolymerizable epoxy compound) | — | — | — | — | — | — |
|  | DURANATE TPA-B80E (manufactured by Asahi Kasei Chemicals Corporation) | — | — | — | — | — | — |
| Other components | N-phenylglycine (manufactured by Junsei Chemical Co., Ltd.) | 0.03 | 0.03 | 0.03 | 0.03 | 0.03 | 0.03 |
|  | 1,2,4-triazole (manufactured by Otsuka Chemical Co., Ltd.) | 0.058 | 0.058 | 0.058 | 0.058 | 0.058 | 0.058 |
|  | Benzoimidazole manufactured by Tokyo Chemical Industry Co., Ltd. | — | — | — | — | — | — |
|  | 5-amine-1H-tetrazole (HAT, manufactured by DescriptionToyobo Co., Ltd.) | — | — | — | — | — | — |
|  | SMAEF-40 (manufactured by Cray Valley) | 0.348 | 0.348 | 0.348 | 0.348 | 0.348 | 0.348 |
|  | MEGAFACE F551A (manufactured by DIC Corporation) | 0.16 | 0.16 | 0.16 | 0.16 | 0.16 | 0.16 |
| Solvent | Methyl ethyl ketone | 43.94 | 43.94 | 43.94 | 43.94 | 43.94 | 43.94 |
| Radically polymerizable compound/binder polymer ratio | | 0.84 | 0.84 | 0.84 | 0.84 | 0.84 | 0.84 |

TABLE 2-continued

|  |  | Examples | | | | | |
| --- | --- | --- | --- | --- | --- | --- | --- |
|  |  | 7 | 8 | 9 | 10 | 11 | 12 |
| Radically polymerizable compound | Tricyclodecane dimethanol diacrylate (A-DCP manufactured by Shin-Nakamura Chemical Co., Ltd.) | 5.53 | 5.53 | 5.53 | 5.53 | 5.53 | 5.53 |
|  | Urethane acrylate 8UX-015A (manufactured by Taisei Fine Chemical Co., Ltd.) | 2.76 | 2.76 | 2.76 | 2.76 | 2.76 | 2.76 |
|  | Urethane acrylate EBECRYL 8465 (manufactured by Daicel-Allnex Ltd.) | — | — | — | — | — | — |
|  | Epoxy acrylate EBECRYL 3703 (manufactured by Daicel-Allnex Ltd.) | — | — | — | — | — | — |
|  | Carboxy acid-containing monomer ARONIX TO-2349 (manufactured by Toagosei Co., Ltd.) | 0.92 | 0.92 | 0.92 | 0.92 | 0.92 | 0.92 |
|  | Ditrimethylolpropane tetraacrylate (AD-TMP manufactured by Shin-Nakamura Chemical Co., Ltd.) | — | — | — | — | — | — |
| Polymer A | P-1 | — | — | — | — | — | — |
|  | P-2 | — | — | — | — | — | — |
|  | P-3 | — | — | — | — | — | — |
|  | P-4 | — | — | — | — | — | — |
|  | P-5 | — | — | — | — | — | — |
|  | P-6 | — | — | — | — | — | — |
|  | P-7 | 42.31 | — | — | — | — | — |
|  | P-8 | — | 42.31 | — | — | — | — |
|  | P-9 | — | — | 42.31 | — | — | — |
|  | P-10 | — | — | — | 42.31 | — | — |
|  | P-11 | — | — | — | — | 42.31 | — |
|  | P-12 | — | — | — | — | — | 42.31 |
|  | P-13 | — | — | — | — | — | — |
|  | P-14 | — | — | — | — | — | — |
|  | P-15 | — | — | — | — | — | — |
|  | P-16 | — | — | — | — | — | — |
|  | P-17 | — | — | — | — | — | — |
|  | R-1 | — | — | — | — | — | — |
|  | R-2 | — | — | — | — | — | — |
|  | R-3 | — | — | — | — | — | — |
|  | R-4 | — | — | — | — | — | — |
| Photopolymerization initiator | Ethanone, 1-[9-ethyl-6-(2-methylbenzoyl)-9H-carbazol-3-yl]-, 1-(O-acetyloxime) (OXE-02, manufactured by BASF Japan Ltd.) | 0.11 | 0.11 | 0.11 | 0.11 | 0.11 | 0.11 |
|  | 2-methyl-1-(4-methylthiophenyl)-2-morpholinopropan-1-one (IRGACURE 907, manufactured by BASF Japan Ltd.) | 0.21 | 0.21 | 0.21 | 0.21 | 0.21 | 0.21 |
|  | 1,2-octanedione, 1-[4-(phenylthio)-, 2-(O-benzoyloxime)] (OXE-01, manufactured by BASF Japan Ltd.) | — | — | — | — | — | — |
| Thermal crosslinking compound | KARENZ AOI-BM (manufactured by Showa Denko KK, photopolymerizable blocked isocyanate) | 3.63 | 3.63 | 3.63 | 3.63 | 3.63 | 3.63 |
|  | KARENZ MOI-BM (manufactured by Showa Denko KK, photopolymerizable blocked isocyanate) | — | — | — | — | — | — |
|  | MA-DGIC (manufactured by Shikoku Chemicals Co., Ltd., photopolymerizable epoxy compound) | — | — | — | — | — | — |
|  | DURANATE TPA-B80E (manufactured by Asahi Kasei Chemicals Corporation) | — | — | — | — | — | — |
| Other components | N-phenylglycine (manufactured by Junsei Chemical Co., Ltd.) | 0.03 | 0.03 | 0.03 | 0.03 | 0.03 | 0.03 |
|  | 1,2,4-triazole (manufactured by Otsuka Chemical Co., Ltd.) | 0.058 | 0.058 | 0.058 | 0.058 | 0.058 | 0.058 |
|  | Benzoimidazole manufactured by Tokyo Chemical Industry Co., Ltd. | — | — | — | — | — | — |
|  | 5-amine-1H-tetrazole (HAT, manufactured by DescriptionToyobo Co., Ltd.) | — | — | — | — | — | — |
|  | SMAEF-40 (manufactured by Cray Valley) | 0.348 | 0.348 | 0.348 | 0.348 | 0.348 | 0.348 |
|  | MEGAFACE F551A (manufactured by DIC Corporation) | 0.16 | 0.16 | 0.16 | 0.16 | 0.16 | 0.16 |
| Solvent | Methyl ethyl ketone | 43.94 | 43.94 | 43.94 | 43.94 | 43.94 | 43.94 |
| Radically polymerizable compound/binder polymer ratio |  | 0.84 | 0.84 | 0.84 | 0.84 | 0.84 | 0.84 |

TABLE 2-continued

|  |  | Examples | | | | |
| --- | --- | --- | --- | --- | --- | --- |
|  |  | 13 | 14 | 15 | 16 | 17 |
| Radically polymerizable compound | Tricyclodecane dimethanol diacrylate (A-DCP manufactured by Shin-Nakamura Chemical Co., Ltd.) | 5.53 | 5.53 | 5.53 | 5.53 | 5.53 |
|  | Urethane acrylate 8UX-015A (manufactured by Taisei Fine Chemical Co., Ltd.) | 2.76 | 2.76 | 2.76 | 2.76 | 2.76 |
|  | Urethane acrylate EBECRYL 8465 (manufactured by Daicel-Allnex Ltd.) | — | — | — | — | — |
|  | Epoxy acrylate EBECRYL 3703 (manufactured by Daicel-Allnex Ltd.) | — | — | — | — | — |
|  | Carboxy acid-containing monomer ARONIX TO-2349 (manufactured by Toagosei Co., Ltd.) | 0.92 | 0.92 | 0.92 | 0.92 | 0.92 |
|  | Ditrimethylolpropane tetraacrylate (AD-TMP manufactured by Shin-Nakamura Chemical Co., Ltd.) | — | — | — | — | — |
| Polymer A | P-1 | — | — | — | — | — |
|  | P-2 | — | — | — | — | — |
|  | P-3 | — | — | — | — | — |
|  | P-4 | — | — | — | — | — |
|  | P-5 | — | — | — | — | — |
|  | P-6 | — | — | — | — | — |
|  | P-7 | — | — | — | — | — |
|  | P-8 | — | — | — | — | — |
|  | P-9 | — | — | — | — | — |
|  | P-10 | — | — | — | — | — |
|  | P-11 | — | — | — | — | — |
|  | P-12 | — | — | — | — | — |
|  | P-13 | 42.31 | — | — | — | — |
|  | P-14 | — | 42.31 | — | — | — |
|  | P-15 | — | — | 42.31 | — | — |
|  | P-16 | — | — | — | 42.31 | — |
|  | P-17 | — | — | — | — | 42.31 |
|  | R-1 | — | — | — | — | — |
|  | R-2 | — | — | — | — | — |
|  | R-3 | — | — | — | — | — |
|  | R-4 | — | — | — | — | — |
| Photopolymerrization initiator | Ethanone, 1-[9-ethyl-6-(2-methylbenzoyl)-9H-carbazol-3-yl]-, 1-(O-acetyloxime) (OXE-02, manufactured by BASF Japan Ltd.) | 0.11 | 0.11 | 0.11 | 0.11 | 0.11 |
|  | 2-methyl-1-(4-methylthiophenyl)-2-morpholinopropan-1-one (IRGACURE 907, manufactured by BASF Japan Ltd.) | 0.21 | 0.21 | 0.21 | 0.21 | 0.21 |
|  | 1,2-octanedione, 1-[4-(phenylthio)-, 2-(O-benzoyloxime)] (OXE-01, manufactured by BASF Japan Ltd.) | — | — | — | — | — |
| Thermal crosslinking compound | KARENZ AOI-BM (manufactured by Showa Denko KK, photopolymerizable blocked isocyanate) | 3.63 | 3.63 | 3.63 | 3.63 | 3.63 |
|  | KARENZ MOI-BM (manufactured by Showa Denko KK, photopolymerizable blocked isocyanate) | — | — | — | — | — |
|  | MA-DGIC (manufactured by Shikoku Chemicals Co., Ltd., photopolymerizable epoxy compound) | — | — | — | — | — |
|  | DURANATE TPA-B80E (manufactured by Asahi Kasei Chemicals Corporation) | — | — | — | — | — |
| Other components | N-phenylglycine (manufactured by Junsei Chemical Co., Ltd.) | 0.03 | 0.03 | 0.03 | 0.03 | 0.03 |
|  | 1,2,4-triazole (manufactured by Otsuka Chemical Co., Ltd.) | 0.058 | 0.058 | 0.058 | 0.058 | 0.058 |
|  | Benzoimidazole manufactured by Tokyo Chemical Industry Co., Ltd.) | — | — | — | — | — |
|  | 5-amine-1H-tetrazole (HAT, manufactured by DescriptionToyobo Co., Ltd.) | — | — | — | — | — |
|  | SMAEF-40 (manufactured by Cray Valley) | 0.348 | 0.348 | 0.348 | 0.348 | 0.348 |
|  | MEGAFACE F551A (manufactured by DIC Corporation) | 0.16 | 0.16 | 0.16 | 0.16 | 0.16 |
| Solvent | Methyl ethyl ketone | 43.94 | 43.94 | 43.94 | 43.94 | 43.94 |
| Radically polymerizable compound/binder polymer ratio | | 0.84 | 0.84 | 0.84 | 0.84 | 0.84 |

TABLE 3

| | | Examples | | | | | |
|---|---|---|---|---|---|---|---|
| | | 18 | 19 | 20 | 21 | 22 | 23 |
| Radically polymerizable compound | Tricyclodecane dimethanol diacrylate (A-DCP manufactured by Shin-Nakamura Chemical Co., Ltd.) | 5.53 | 5.53 | 4.42 | 6.64 | 5.53 | 5.53 |
| | Urethane acrylate 8UX-015A (manufactured by Taisei Fine Chemical Co., Ltd.) | — | — | 2.21 | 3.32 | 2.76 | 2.76 |
| | Urethane acrylate EBECRYL 8465 (manufactured by Daicel-Allnex Ltd.) | 1.84 | — | — | — | — | — |
| | Epoxy acrylate EBECRYL 3703 (manufactured by Daicel-Allnex Ltd.) | 0.92 | — | — | — | — | — |
| | Carboxy acid-containing monomer ARONIX TO-2349 (manufactured by Toagosei Co., Ltd.) | 0.92 | 0.92 | 0.74 | 1.11 | 0.92 | 0.92 |
| | Ditrimethylolpropane tetraacrylate (AD-TMP manufactured by Shin-Nakamura Chemical Co., Ltd.) | — | 2.76 | — | — | — | — |
| Polymer A | P-1 | 42.31 | 42.31 | 47.39 | 37.24 | 42.31 | 42.31 |
| | P-2 | — | — | — | — | — | — |
| | P-3 | — | — | — | — | — | — |
| | P-4 | — | — | — | — | — | — |
| | P-5 | — | — | — | — | — | — |
| | P-6 | — | — | — | — | — | — |
| | P-7 | — | — | — | — | — | — |
| | P-8 | — | — | — | — | — | — |
| | P-9 | — | — | — | — | — | — |
| | P-10 | — | — | — | — | — | — |
| | p-11 | — | — | — | — | — | — |
| | P-12 | — | — | — | — | — | — |
| | P-13 | — | — | — | — | — | — |
| | P-14 | — | — | — | — | — | — |
| | P-15 | — | — | — | — | — | — |
| | P-16 | — | — | — | — | — | — |
| | P-17 | — | — | — | — | — | — |
| | R-1 | — | — | — | — | — | — |
| | R-2 | — | — | — | — | — | — |
| | R-3 | — | — | — | — | — | — |
| | R-4 | — | — | — | — | — | — |
| Photopolymerization initiator | Ethanone, 1-[9-ethyl-6-(2-methylbenzoyl)-9H-carbazol-3-yl]-, 1-(O-acetyloxime) (OXE-02, manufactured by BASF Japan Ltd.) | 0.11 | 0.11 | 0.11 | 0.11 | 0.11 | 0.11 |
| | 2-methyl-1-(4-methylthiophenyl)-2-morpholinopropan-1-one (IRGACURE 907, manufactured by BASF Japan Ltd.) | 0.21 | 0.21 | 0.21 | 0.21 | 0.21 | 0.21 |
| | 1,2-octanedione, 1-[4-(phenylthio)-, 2-(O-benzoyloxime)] (OXE-01, manufactured by BASF Japan Ltd.) | — | — | — | — | — | — |
| Thermal crosslinking compound | KARENZ AOI-BM (manufactured by Showa Denko KK, photopolymerizable blocked isocyanate) | 3.63 | 3.63 | 3.63 | 3.63 | — | — |
| | KARENZ MOI-BM (manufactured by Showa Denko KK, photopolymerizable blocked isocyanate) | — | — | — | — | 3.63 | — |
| | MA-DGIC (manufactured by Shikoku Chemicals Co., Ltd., photopolymerizable epoxy compound) | — | — | — | — | — | 3.63 |
| | DURANATE TPA-B80E (manufactured by Asahi Kasei Chemicals Corporation) | — | — | — | — | — | — |
| Other components | N-phenylglycine (manufactured by Junsei Chemical Co., Ltd.) | 0.03 | 0.03 | 0.03 | 0.03 | 0.03 | 0.03 |
| | 1,2,4-triazole (manufactured by Otsuka Chemical Co., Ltd.) | 0.058 | 0.058 | 0.058 | 0.058 | 0.058 | 0.058 |
| | Benzoimidazole manufactured by Tokyo Chemical Industry Co., Ltd.) | — | — | — | — | — | — |
| | 5-amine-1H-tetrazole (HAT, manufactured by DescriptionToyobo Co., Ltd.) | — | — | — | — | — | — |

TABLE 3-continued

|  |  |  |  |  |  |  |
|---|---|---|---|---|---|---|
|  | SMAEF-40 (manufactured by Cray Valley) | 0.348 | 0.348 | 0.348 | 0.348 | 0.348 | 0.348 |
|  | MEGAFACE F551A (manufactured by DIC Corporation) | 0.16 | 0.16 | 0.16 | 0.16 | 0.16 | 0.16 |
| Solvent | Methyl ethyl ketone | 43.94 | 43.94 | 40.70 | 47.17 | 43.94 | 43.94 |
| Radically polymerizable compound/binder polymer ratio |  | 0.84 | 0.84 | 0.64 | 1.09 | 0.84 | 0.84 |

|  |  | Examples ||||| 
|---|---|---|---|---|---|---|
|  |  | 24 | 25 | 26 | 27 | 28 |
| Radically polymerizable compound | Tricyclodecane dimethanol diacrylate (A-DCP manufactured by Shin-Nakamura Chemical Co., Ltd.) | 5.53 | 5.53 | 5.53 | 5.53 | 5.53 |
|  | Urethane acrylate 8UX-015A (manufactured by Taisei Fine Chemical Co., Ltd.) | 2.76 | 2.76 | 2.76 | 2.76 | 2.76 |
|  | Urethane acrylate EBECRYL 8465 (manufactured by Daicel-Allnex Ltd.) | — | — | — | — | — |
|  | Epoxy acrylate EBECRYL 3703 (manufactured by Daicel-Allnex Ltd.) | — | — | — | — | — |
|  | Carboxy acid-containing monomer ARONIX TO-2349 (manufactured by Toagosei Co., Ltd.) | 0.92 | 0.92 | 0.92 | 0.92 | 0.92 |
|  | Ditrimethylolpropane tetraacrylate (AD-TMP manufactured by Shin-Nakamura Chemical Co., Ltd.) | — | — | — | — | — |
| Polymer A | P-1 | 42.31 | 52.30 | 42.31 | 42.31 | 52.30 |
|  | P-2 | — | — | — | — | — |
|  | P-3 | — | — | — | — | — |
|  | P-4 | — | — | — | — | — |
|  | P-5 | — | — | — | — | — |
|  | P-6 | — | — | — | — | — |
|  | P-7 | — | — | — | — | — |
|  | P-8 | — | — | — | — | — |
|  | P-9 | — | — | — | — | — |
|  | P-10 | — | — | — | — | — |
|  | p-11 | — | — | — | — | — |
|  | P-12 | — | — | — | — | — |
|  | P-13 | — | — | — | — | — |
|  | P-14 | — | — | — | — | — |
|  | P-15 | — | — | — | — | — |
|  | P-16 | — | — | — | — | — |
|  | P-17 | — | — | — | — | — |
|  | R-1 | — | — | — | — | — |
|  | R-2 | — | — | — | — | — |
|  | R-3 | — | — | — | — | — |
|  | R-4 | — | — | — | — | — |
| Photopolymerization initiator | Ethanone, 1-[9-ethyl-6-(2-methylbenzoyl)-9H-carbazol-3-yl]-, 1-(O-acetyloxime) (OXE-02, manufactured by BASF Japan Ltd.) | 0.11 | 0.11 | 0.11 | 0.11 | — |
|  | 2-methyl-1-(4-methylthiophenyl)-2-morpholinopropan-1-one (IRGACURE 907, manufactured by BASF Japan Ltd.) | 0.21 | 0.21 | 0.21 | 0.21 | — |
|  | 1,2-octanedione, 1-[4-(phenylthio)-, 2-(O-benzoyloxime)] (OXE-01, manufactured by BASF Japan Ltd.) | — | — | — | — | 0.35 |
| Thermal crosslinking compound | KARENZ AOI-BM (manufactured by Showa Denko KK, photopolymerizable blocked isocyanate) | — | — | 3.63 | 3.63 | — |
|  | KARENZ MOI-BM (manufactured by Showa Denko KK, photopolymerizable blocked isocyanate) |  |  |  |  |  |
|  | MA-DGIC (manufactured by Shikoku Chemicals Co., Ltd., photopolymerizable epoxy compound) | — | — | — | — | — |
|  | DURANATE TPA-B80E (manufactured by Asahi Kasei Chemicals Corporation) | 4.53 | — | — | — | — |
| Other components | N-phenylglycine (manufactured by Junsei Chemical Co., Ltd.) | 0.03 | 0.03 | 0.03 | 0.03 | — |
|  | 1,2,4-triazole (manufactured by Otsuka Chemical Co., Ltd.) | 0.058 | 0.058 | — | — | — |

TABLE 3-continued

|  |  |  |  |  |  |  |
|---|---|---|---|---|---|---|
|  | Benzoimidazole manufactured by Tokyo Chemical Industry Co., Ltd.) |  | — | — | 0.058 | — | — |
|  | 5-amine-1H-tetrazole (HAT, manufactured by DescriptionToyobo Co., Ltd.) | — | — | — | 0.058 | — |
|  | SMAEF-40 (manufactured by Cray Valley) | 0.348 | 0.348 | 0.348 | 0.348 | — |
|  | MEGAFACE F551A (manufactured by DIC Corporation) | 0.16 | 0.16 | 0.16 | 0.16 | 0.16 |
| Solvent | Methyl ethyl ketone | 43.03 | 37.58 | 43.94 | 43.94 | 37.98 |
| Radically polymerizable compound/binder polymer ratio |  | 0.60 | 0.49 | 0.84 | 0.84 | 0.49 |

|  |  |  | Comparative Examples ||||
|---|---|---|---|---|---|---|
|  |  |  | 1 | 2 | 3 | 4 |
| Radically polymerizable compound | Tricyclodecane dimethanol diacrylate (A-DCP manufactured by Shin-Nakamura Chemical Co., Ltd.) | 5.53 | 5.53 | 5.53 | 5.53 |
|  | Urethane acrylate 8UX-015A (manufactured by Taisei Fine Chemical Co., Ltd.) | 2.76 | 2.76 | 2.76 | 2.76 |
|  | Urethane acrylate EBECRYL 8465 (manufactured by Daicel-Allnex Ltd.) | — | — | — | — |
|  | Epoxy acrylate EBECRYL 3703 (manufactured by Daicel-Allnex Ltd.) | — | — | — | — |
|  | Carboxy acid-containing monomer ARONIX TO-2349 (manufactured by Toagosei Co., Ltd.) | 0.92 | 0.92 | 0.92 | 0.92 |
|  | Ditrimethylolpropane tetraacrylate (AD-TMP manufactured by Shin-Nakamura Chemical Co., Ltd.) | — | — | — | — |
| Polymer A | P-1 | — | — | — | — |
|  | P-2 | — | — | — | — |
|  | P-3 | — | — | — | — |
|  | P-4 | — | — | — | — |
|  | P-5 | — | — | — | — |
|  | P-6 | — | — | — | — |
|  | P-7 | — | — | — | — |
|  | P-8 | — | — | — | — |
|  | P-9 | — | — | — | — |
|  | P-10 | — | — | — | — |
|  | p-11 | — | — | — | — |
|  | P-12 | — | — | — | — |
|  | P-13 | — | — | — | — |
|  | P-14 | — | — | — | — |
|  | P-15 | — | — | — | — |
|  | P-16 | — | — | — | — |
|  | P-17 | — | — | — | — |
|  | R-1 | 42.31 | — | — | — |
|  | R-2 | — | 42.31 | — | — |
|  | R-3 | — | — | 42.31 | — |
|  | R-4 | — | — | — | 42.31 |
| Photopolymerization initiator | Ethanone, 1-[9-ethyl-6-(2-methylbenzoyl)-9H-carbazol-3-yl]-, 1-(O-acetyloxime) (OXE-02, manufactured by BASF Japan Ltd.) | 0.11 | 0.11 | 0.11 | 0.11 |
|  | 2-methyl-1-(4-methylthiophenyl)-2-morpholinopropan-1-one (IRGACURE 907, manufactured by BASF Japan Ltd.) | 0.21 | 0.21 | 0.21 | 0.21 |
|  | 1,2-octanedione, 1-[4-(phenylthio)-, 2-(O-benzyloxime)] (OXE-01, manufactured by BASF Japan Ltd.) | — | — | — | — |
| Thermal crosslinking compound | KARENZ AOI-BM (manufactured by Showa Denko KK, photopolymerizable blocked isocyanate) | 3.63 | 3.63 | 3.63 | 3.63 |
|  | KARENZ MOI-BM (manufactured by Showa Denko KK, photopolymerizable blocked isocyanate) | — | — | — | — |
|  | MA-DGIC (manufactured by Shikoku Chemicals Co., Ltd., photopolymerizable epoxy compound) | — | — | — | — |
|  | DURANATE TPA-B80E (manufactured by Asahi Kasei Chemicals Corporation) | — | — | — | — |

TABLE 3-continued

| | | | | | |
|---|---|---|---|---|---|
| Other components | N-phenylglycine (manufactured by Junsei Chemical Co., Ltd.) | 0.03 | 0.03 | 0.03 | 0.03 |
| | 1,2,4-triazole (manufactured by Otsuka Chemical Co., Ltd.) | 0.058 | 0.058 | 0.058 | 0.058 |
| | Benzoimidazole manufactured by Tokyo Chemical Industry Co., Ltd.) | — | — | — | — |
| | 5-amine-1H-tetrazole (HAT, manufactured by DescriptionToyobo Co., Ltd.) | — | — | — | — |
| | SMAEF-40 (manufactured by Cray Valley) | 0.348 | 0.348 | 0.348 | 0.348 |
| | MEGAFACE F551A (manufactured by DIC Corporation) | 0.16 | 0.16 | 0.16 | 0.16 |
| Solvent | Methyl ethyl ketone | 43.94 | 43.94 | 43.94 | 43.94 |
| Radically polymerizable compound/binder polymer ratio | | 0.84 | 0.84 | 0.84 | 0.84 |

<Manufacturing of Transfer Film>

In each example or comparative example, the photosensitive composition shown in Table 2 or 3 prepared in each example or comparative example was applied on a temporary support having a thickness of 16 μm which is a polyethylene terephthalate film by using a slit-shaped nozzle, and accordingly, a photosensitive transparent resin layer having a thickness after drying of 8 μm was formed. A protective film (polyethylene phthalate film having a thickness of 16 μm) was pressed on the photosensitive transparent resin layer, and each transfer film of Examples 1 to 28 and Comparative Examples 1 to 4 was manufactured.

<Evaluation of Water Vapor Transmission Rate (WVTR)>

(Manufacturing of Sample for Measuring Water Vapor Permeability)

The transfer film of each example or comparative example was laminated on PTFE (tetrafluoroethylene resin) membrane filter FP-100-100 (hereinafter simply referred to as a "membrane filter") manufactured by Sumitomo Electric Industries, Ltd., after the protective film is peeled off, and a laminate A having a laminated structure of "temporary support/photosensitive layer having a thickness of 8 μm/membrane filter" was formed. In the lamination conditions, a membrane filter temperature was set as 40° C., a laminating roll temperature was set as 110° C., a linear pressure was set as 3 N/cm, and a transportation speed was set as 2 m/min.

In addition, the temporary support was peeled off from the laminate A, and the transfer film obtained by peeling the protective film from the photosensitive layer was further laminated four times in the same manner as described above, and a laminate B having a laminated structure of "temporary support/photosensitive layer having a total film thickness of 40 μm/membrane filter" was formed.

The photosensitive layer of the obtained laminate B was exposed through the temporary support using a proximity type exposure machine (manufactured by Hitachi High-Tech Electronics Engineering Co., Ltd.) including an ultra-high pressure mercury lamp with an exposure intensity of 100 mJ/cm$^2$ (i ray). After the temporary support was peeled off, exposure was further performed with an exposure intensity of 375 mJ/cm$^2$ (i ray), and post baking was performed at 170° C. for 30 minutes to harden the photosensitive layer, thereby forming a cured film.

Accordingly, a sample for measuring water vapor permeability having a laminated structure of "cured film having a total film thickness of 40 μm/membrane filter" was obtained.

[Measurement of Water Vapor Transmission Rate (WVTR)]

The measurement of the water vapor permeability was performed by a cup method using the sample for measuring water vapor permeability, with reference to JIS-Z-0208 (1976). Hereinafter, the details will be described.

First, a circular sample having a diameter of 70 mm was cut from the sample for measuring water vapor permeability. Next, 20 g of dried calcium chloride was put in a measurement cup, and covered with the circular sample, and accordingly, a lid-attached measurement cup was prepared.

This lid-attached measurement cup was left in a constant-temperature and constant-humidity tank for 24 hours under the condition of 65° C. with 90% RH. The water vapor transmission rate (WVTR) of the circular sample (unit: g/m$^2$·day) was calculated from a change in mass of the lid-attached measurement cup before and after the leaving.

The measurement described above was performed three times and an average value of the WVTRs in three times of the measurement was calculated. The water vapor transmission rate (WVTR) was evaluated based on the average value of the WVTR according to the evaluation standards. In the evaluation standard below, any of A, B, and C is preferable, A or B is more preferable, and A is most preferable.

The results are shown in Table 4.

In the measurement, the WVTR of the circular sample having a laminated structure of "cured film/membrane filter" was measured as described above. However, the WVTR of the membrane filter is extremely higher than the WVTR of the cured film (easily transmits water vapor), and accordingly, in the measurement, the WVTR of the cured film is substantially measured.

[Evaluation Standard of Water Vapor Transmission Rate (WVTR)]

A: Average value of WVTR is less than 160 g/(m$^2$·day)

B: Average value of WVTR is 160 g/(m$^2$·day) or more and less than 180 g/(m$^2$·day)

C: Average value of WVTR is 180 g/(m$^2$·day) or more and less than 200 g/(m$^2$·day)

D: Average value of WVTR is 200 g/(m$^2$·day) or more and less than 250 g/(m$^2$·day)

E: Average value of WVTR is 250 g/(m$^2$·day) or more

[Evaluation of Tackiness]

The transfer film in each example or comparative example was cut into a rectangle having a size of 5 cm×18 cm. A polytetrafluoroethylene (PFA) film having a thickness of 500 μm was cut into a rectangle having a size of 10 cm×15 cm and fixed on a horizontal surface. The PFA film and the transfer film were laminated so that the PFA film and the surface of the cut transfer film on which the photosensitive layer was formed were in contact with each other, and a weight of 70 g having a rectangular parallelepiped shape having a bottom having a size of 4 cm×6 cm was loaded thereon. Using Force Gauge Stand manufactured by Shimpo, the laminated transfer film was pulled at a constant speed in a horizontal direction parallel to the long side of the transfer film, and a friction force (unit: N) under the load of the weight was measured.

The value obtained by dividing the friction force by 70 (hereinafter, also referred to as a "tackiness index value") was set as an index of tackiness.
In the evaluation standard below, any of A, B, and C is preferable, A or B is more preferable, and A is most preferable.

The evaluation results are shown in Table 4.
[Evaluation Standards of Tackiness]
A: The tackiness index value is less than 2.
B: The tackiness index value is 2 or more and less than 4.
C: The tackiness index value is 4 or more and less than 6.
D: The tackiness index value is 6 or more and less than 10.
E: tackiness index value is 10 or more.
[Evaluation of Scratch Resistance in Developer]
The transfer film of each example or comparative example was cut into a size of 4.5 cm×9 cm and laminated on glass having a size of 5 cm×10 cm (EAGLE XG, manufactured by Corning Incorporated), after the protective film is peeled off, and a laminate having a layer structure of "temporary support/photosensitive layer having a thickness of 8 μm/glass" was formed. In the lamination conditions, a membrane filter temperature was set as 40° C., a laminating roll temperature was set as 110° C., a linear pressure was set as 3 N/cm, and a transportation speed was set as 2 m/min. After that, the entire surface was exposed through the temporary support using a proximity type exposure machine (manufactured by Hitachi High-Tech Electronics Engineering Co., Ltd.) including an ultra-high pressure mercury lamp with an exposure intensity of 100 mJ/cm$^2$ (i ray).

The temporary support was peeled off from the laminate after two hours from the exposure, a sodium carbonate aqueous solution having a concentration of 1% by mass and a width of approximately 1 cm at a temperature of 33° C. was added dropwise to a surface of the photosensitive layer of the laminate with a dropper over a length of approximately 6 cm, an then, the surface of the photosensitive layer was scratched in a developer using a tribogear (Surface property measuring device TYPE: 14DR, manufactured by Shinto Kagaku Co., Ltd.). Here, as an indenter for scratching, a diamond indenter having a circular tip and a diameter of the tip of 7 μm was used, the load condition was 10 g, and the speed was 60 mm/min.

A depth of the scratch on the surface of the photosensitive layer after the scratching was measured using a three-dimensional optical profiler (Zygo NewView6210, manufactured by Canon Inc.), and the depth of the scratch was set an index of the evaluation for scratch resistance in a developer.

In the evaluation standard below, any of A, B, and C is preferable, A or B is more preferable, and A is most preferable.

The evaluation results are shown in Table 4.
[Evaluation standard for Scratch Resistance in Developer]
A: The depth of the scratch is less than 0.10 μm.
B: The depth of the scratch is 0.10 μm or more and less than 0.15 μm.
C: The depth of the scratch is 0.15 μm or more and less than 0.20 μm.
D: The depth of the scratch is 0.20 μm or more and less than 0.30 μm.
E: The depth of the scratch is 0.30 μm or more.

TABLE 4

|  |  | Water vapor transmission rate (WVTR) | Tackiness | Scratch resistance in developer |
|---|---|---|---|---|
| Examples | 1 | A | A | A |
|  | 2 | B | A | A |
|  | 3 | C | A | A |
|  | 4 | A | A | A |
|  | 5 | A | A | A |
|  | 6 | A | A | A |
|  | 7 | A | B | A |
|  | 8 | A | C | A |
|  | 9 | A | A | A |
|  | 10 | A | A | A |
|  | 11 | A | A | A |
|  | 12 | A | B | A |
|  | 13 | A | C | A |
|  | 14 | A | A | A |
|  | 15 | A | A | A |
|  | 16 | A | A | A |
|  | 17 | A | A | A |
|  | 18 | A | A | A |
|  | 19 | A | A | A |
|  | 20 | A | A | A |
|  | 21 | A | A | A |
|  | 22 | B | A | B |
|  | 23 | A | B | A |
|  | 24 | A | A | A |
|  | 25 | B | A | A |
|  | 26 | A | A | C |
|  | 27 | C | A | C |
|  | 28 | A | A | A |
|  | 29 | A | A | A |
|  | 30 | C | A | C |
| Comparative Examples | 1 | E | A | C |
|  | 2 | B | D | C |
|  | 3 | C | E | C |
|  | 4 | B | A | E |

As shown in Table 4, it is found that, each of the transfer films according to Examples 1 to 28 including a temporary support; and a photosensitive layer, in which the photosensitive layer includes a polymer A containing a constitutional unit represented by Formula A1, a constitutional unit derived from a monomer having an alicyclic structure, and a constitutional unit having a radically polymerizable group, a radically polymerizable compound, and a photopolymerization initiator, a content of the constitutional unit represented by Formula A1 is 10% by mass or more with respect to a total mass of the polymer A, a content of the constitutional unit derived from the monomer having the alicyclic structure is 15% by mass or more with respect to a total mass of the polymer A, and a glass transition temperature of a homopolymer of the monomer having the alicyclic structure is 120° C. or higher, includes a cured film having a decreased water vapor transmission rate (WVTR) and has a low tackiness and excellent scratch resistance in a developer.

In Comparative Example 1, the content of the constitutional unit A1 is 5% by mass, and in such a case, it is found that the WVTR is not decreased.

In Comparative Example 2, the content of the constitutional unit B1 is 12% by mass, and in such a case, it is found that the tackiness is large.

In Comparative Example 3, the Tg of the homopolymer of the monomer in the constitutional unit corresponding to the constitutional unit B1 (the constitutional unit derived from cyclohexyl methacrylate) is 66° C., and in such a case, it is found that the tackiness is large.

In Comparative Example 4, the constitutional unit C1 is not included in the polymer, and in such a case, it is found that the scratch resistance in the developer is low.

Examples 101 to 128: Manufacturing of Touch Panel

Each photosensitive composition prepared in Examples 1 to 28 was applied on a temporary support having a thickness of 16 μm which is a polyethylene terephthalate film by using a slit-shaped nozzle, and accordingly, a photosensitive transparent resin layer having a thickness of 8 μm after drying was formed. A material B-17 of the example of WO2017/155003 was applied onto the photosensitive transparent resin layer to form a layer having a high refractive index having a film thickness of 90 nm after drying. A protective film (polyethylene phthalate film having a thickness of 16 μm) was pressed on the layer having a high refractive index, and transfer films of Examples 101 to 128 were manufactured.

After peeling off the protective film of the transfer film of Examples 101 to 128, the laminating was performed to have a laminated structure of "ITO transparent electrode pattern/ refractive index adjusting layer/cycloolefin polymer (COP) substrate", and a laminate having a laminated structure of "photosensitive layer having a thickness of 8 μm/layer having a high refractive index/ITO transparent electrode pattern/refractive index adjusting layer/COP substrate" was formed. In the lamination conditions, a substrate temperature was set as 40° C., a laminating roll temperature was set as 110° C., a linear pressure was set as 3 N/cm, and a transportation speed was set as 2 m/min. Regarding the photosensitive layer of the laminate, a distance between a surface of an exposure mask (quartz exposure mask including a pattern for forming overcoat) and the temporary support was set as 125 μm, and the exposure was performed with an exposure intensity of 100 mJ/cm² (i ray) through the temporary support, by using a proximity type exposure machine including an ultra-high pressure mercury lamp (manufactured by Hitachi High-Technologies Corporation). After the temporary support was peeled off, development was performed with a sodium carbonate aqueous solution having a concentration of 1% by mass and a temperature of 33° C. to remove unnecessary portions. The exposure was further performed with an exposure intensity of 375 mJ/cm² (i-line), and post baking was performed at 170° C. for 30 minutes to harden the photosensitive layer.

A touch panel was manufactured by a well-known method using the prepared laminate having a laminated structure of "cured photosensitive layer/layer having a high refractive index/ITO transparent electrode pattern/refractive index adjusting layer/COP substrate". The manufactured touch panel was bonded to a liquid crystal display element manufactured by a method disclosed in paragraphs <0097> to <0119> of JP2009-47936A to manufacture a liquid crystal display device including the touch panel.

It was confirmed that the liquid crystal display device provided with the touch panel has excellent display properties and operated without any problem.

EXPLANATION OF REFERENCES

10: transfer film
12: temporary support
16: protective film
18: photosensitive layer (electrode protective film for touch panel)
20, 20A: layer having high refractive index (first refractive index adjusting layer)
30: touch panel
32: substrate
34: transparent electrode pattern
36: second refractive index adjusting layer
40: first region where transparent electrode pattern is present
42: second region where transparent electrode pattern is not present
56: leading wiring
70: first transparent electrode pattern
72: second transparent electrode pattern
74: image display region
75: image non-display region
90: touch panel

What is claimed is:
1. A transfer film comprising: a temporary support; and a photosensitive layer,
wherein the photosensitive layer includes
a polymer A containing a constitutional unit represented by Formula A1, a constitutional unit derived from a monomer having a hydrocarbon cyclic structure which is a 5- to 30-membered ring, and a constitutional unit having a radically polymerizable group,
a radically polymerizable compound, and
a photopolymerization initiator,
a content of the constitutional unit represented by Formula A1 is 10% by mass or more with respect to a total mass of the polymer A,
a content of the constitutional unit derived from the monomer having the hydrocarbon cyclic structure which is a 5- to 30-membered ring is 15% by mass to 50% by mass with respect to a total mass of the polymer A, and
a glass transition temperature of a homopolymer of the monomer having the hydrocarbon cyclic structure which is a 5- to 30-membered ring is 120° C. or higher,

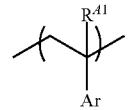

Formula A1 in Formula A1, Ar represents a phenyl group or a naphthyl group and $R^{41}$ represents a hydrogen atom or an alkyl group.

2. The transfer film according to claim 1,
wherein a content of the constitutional unit having the radically polymerizable group is 5% by mass to 60% by mass with respect to a total mass of the polymer A.

3. The transfer film according to claim 1,
wherein the polymer A further includes a constitutional unit having an acid group.

4. The transfer film according to claim 1,
wherein the photosensitive layer further includes a thermal crosslinking compound.

5. The transfer film according to claim 4,
wherein a thermal crosslinking group in the thermal crosslinking compound is a blocked isocyanate group.

6. The transfer film according to claim 4,
wherein the thermal crosslinking compound includes a radically polymerizable group.

7. The transfer film according to claim 1,
wherein the transfer film is used for forming a protective film for a touch panel.

8. The transfer film according to claim 1,
wherein the content of the constitutional unit represented by Formula A1 is 15% by mass to 50% by mass with respect to a total mass of the polymer A.

9. The transfer film according to claim 1,
wherein a content of the constitutional unit having a radically polymerizable group is 27% by mass to 50% by mass with respect to a total mass of the polymer A.

10. The transfer film according to claim 1,
wherein the radically polymerizable compound includes a difunctional radically polymerizable compound and a tri- or higher functional radically polymerizable compound.

11. The transfer film according to claim 1,
wherein the constitutional unit represented by Formula A1 is the following constitutional unit:

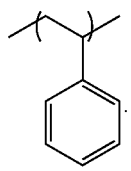

12. The transfer film according to claim 1,
wherein the monomer having the hydrocarbon cyclic structure which is a 5- to 30-membered ring is a constitutional unit derived from dicyclopentanyl methacrylate or dicyclopentanyl acrylate.

13. The transfer film according to claim 1,
wherein the constitutional unit having a radically polymerizable group is represented by Formula C2, in which $R^2$ and $R^3$ each independently represents a hydrogen atom or an alkyl group and L represents a divalent linking group:

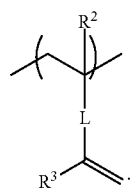

Formula C2

14. An electrode protective film, comprising: the transfer film according to claim 1, from which the temporary support has been removed.

15. A laminate comprising:
a photosensitive layer obtained by removing the temporary support from the transfer film according to claim 1, on a substrate including an electrode of a capacitive input device.

16. A capacitive input device comprising:
the electrode protective film according to claim 14.

17. A capacitive input device comprising:
the laminate according to claim 15.

18. A manufacturing method of a touch panel, comprising:
preparing a substrate for a touch panel having a structure in which at least one of an electrode for a touch panel or a wiring for a touch panel is disposed on a substrate;
forming a photosensitive layer on a surface of the substrate for a touch panel, on a side where at least one of the electrode for a touch panel or the wiring for a touch panel is disposed, by using the transfer film according to claim 1;
performing pattern-exposing on the photosensitive layer formed on the substrate for a touch panel; and
developing the pattern-exposed photosensitive layer to obtain a protective film for a touch panel, the protective film protecting at least a part of at least one of the electrode for a touch panel or the wiring for a touch panel.

19. The transfer film according to claim 1,
wherein the content of the constitutional unit represented by Formula A1 is 15% by mass to 50% by mass with respect to a total mass of the polymer A,
a content of the constitutional unit having a radically polymerizable group is 27% by mass to 50% by mass with respect to a total mass of the polymer A, and
the radically polymerizable compound includes a difunctional radically polymerizable compound and a tri- or higher functional radically polymerizable compound.

20. A transfer film comprising: a temporary support; and
a photosensitive layer,
wherein the photosensitive layer includes
a polymer A containing a constitutional unit represented by Formula A1, a constitutional unit derived from a monomer having an alicyclic structure, and a constitutional unit having a radically polymerizable group,
a radically polymerizable compound, and
a photopolymerization initiator,
the radically polymerizable compound includes a difunctional radically polymerizable compound and a tri- or higher functional radically polymerizable compound,
the content of the constitutional unit represented by Formula A1 is 10% by mass or more with respect to the total mass of the polymer A,
the content of the constitutional unit derived from the monomer having the alicyclic structure is 15% by mass or more with respect to the total mass of the polymer A, and
the glass transition temperature of a homopolymer of the monomer having the alicyclic structure is 120° C. or higher,

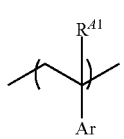

Formula A1 in Formula A1, Ar represents a phenyl group or a naphthyl group and $R^{A1}$ represents a hydrogen atom or an alkyl group.

21. An electrode protective film, comprising the transfer film according to claim 20, from which the temporary support has been removed.

22. A capacitive input device comprising the electrode protective film according to claim 21.

* * * * *